United States Patent
Yamauchi et al.

(10) Patent No.: US 6,495,294 B1
(45) Date of Patent: Dec. 17, 2002

(54) METHOD FOR MANUFACTURING SEMICONDUCTOR SUBSTRATE HAVING AN EPITAXIAL FILM IN THE TRENCH

(75) Inventors: Shoichi Yamauchi, Obu (JP); Yasushi Urakami, Tokai (JP); Kunihiro Onoda, Nagoya (JP); Toshio Sakakibara, Nishio (JP); Yoshinori Otsuka, Okazaki (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 09/696,951

(22) Filed: Oct. 27, 2000

(30) Foreign Application Priority Data

Oct. 28, 1999 (JP) .............................. 11-307656
Sep. 5, 2000 (JP) ........................ 2000-268960

(51) Int. Cl.⁷ ............................................. H01L 21/76
(52) U.S. Cl. .................... 429/597; 438/413; 438/388
(58) Field of Search ................. 438/243–245, 438/386–388, 413, 429

(56) References Cited

U.S. PATENT DOCUMENTS

| 4,466,173 A | | 8/1984 | Baliga |
| 4,758,531 A | * | 7/1988 | Beyer et al. ......... 148/DIG. 26 |
| 5,216,275 A | | 6/1993 | Chen |
| 5,438,215 A | | 8/1995 | Tihanyi |
| 5,463,254 A | * | 10/1995 | Iyer et al. ................... 257/757 |
| 5,739,563 A | * | 4/1998 | Kawakubo et al. ......... 257/295 |
| 5,893,735 A | * | 4/1999 | Stengl et al. ............... 438/243 |

FOREIGN PATENT DOCUMENTS

| EP | 05-3854 | 6/1985 |
| JP | 53-94775 | 8/1978 |

OTHER PUBLICATIONS

Deboy et al., "A new generation of high voltage MOSFETS breaks the limit line of silicon," IEDM 98, Dec. 1998. (Note: discussed on p. 2 of specification).

* cited by examiner

*Primary Examiner*—Jey Tsai
(74) *Attorney, Agent, or Firm*—Law Offices of David G. Posz

(57) ABSTRACT

A trench is formed in a silicon substrate, and an epitaxial film is formed on the substrate and in the trench. After a part of the epitaxial film formed around an opening portion of the trench is etched, another epitaxial film is formed on the substrate and in the trench. Accordingly, the trench can be filled with the epitaxial films completely. Then, the surface of the substrate is flattened.

38 Claims, 16 Drawing Sheets

METHOD FOR MANUFACTURING SEMICONDUCTOR SUBSTRATE HAVING AN EPITAXIAL FILM IN THE TRENCH

CROSS REFERENCE TO RELATED APPLICATIONS

This application is based upon and claims the benefit of Japanese Patent Applications No. 11-307656 filed on Oct. 28, 1999, and No. 2000-268960 filed on Sep. 5, 2000, the contents of which are incorporated herein by reference.

BACKGROUND OF THE INVENTION

1. Field of the Invention

The present invention relates to a substrate processing technique for formation of a semiconductor element.

2. Description of the Related Art

As shown in FIG. 18, to form a doping layer 101 uniform in a depth direction at a desired position in a silicon substrate 100 not only attracts attention as a substrate structure effective in lowering an on resistance of a high withstand voltage MOS device disclosed in U.S. Pat. No. 5,438,215, but also is effective to enable high integration in the depth direction by effectively using the depth direction of the substrate.

As a method of forming the doping layer 101, it is conceivable to use dopant diffusion from the surface, or a method of dopant ion implantation and heat treatment, which is conventionally generally used in a silicon semiconductor process. However, the depth B of the doping layer 101 is controlled by the diffusion rate of the dopant impurity. Thus, in a generally used heat treatment time, it is possible to merely form the doping layer 101 of a depth of several μm from the surface. Besides, since the diffusion of the dopant advances isotropically, the diffusion advances not only in the depth direction but also in the lateral direction, and the doping layer 101 having a lateral extension A comparable to the depth is eventually obtained. Thus, in the doping layer formation by the conventional heat diffusion, an aspect ratio (=B/A) does not exceed "1" in principle, and the structure in formation of a device is restricted.

On the other hand, "A new generation of high power MOSFETs breaks the limit line of silicon" IEDM98 Proc. (1998) by G. Deboy et al., proposes the following method. That is, first, as shown in FIGS. 19A and 19B, an epitaxial film 111a is formed on a substrate 110 by epitaxial growth, and as shown in FIG. 19C, a doping layer 112a is formed by partial dopant ion implantation with photolithography and heat diffusion treatment. Next, as shown in FIGS. 20A and 20B, the epitaxial growth, partial ion implantation, and heat diffusion treatment are repeated. As a result, as shown in FIG. 20C, a doping layer 112 extending in the depth direction is formed. According to this method, since the depth of the formed doping layer (doping layer extending in the depth direction) 112 is determined by epitaxial growth thickness, it is not controlled by the diffusion length of the dopant.

However, since the extension in the lateral direction is controlled through the diffusion length of one diffusion treatment, the lateral extension equivalent to the film thickness of one epitaxial growth becomes a processing limit. Thus, in the case where a deeper profile is desired to be formed, it is sufficient if the epitaxial film thickness is increased. However, in order to suppress the extension in the lateral direction, it is necessary to thin the thickness of one epitaxial growth. As a result, the number of times of the epitaxial growth and diffusion treatment of the dopant is increased, and the manufacturing cost of a substrate is increased.

Besides, a processing method proposed in EP-A-53854 is shown in FIGS. 21A–21C. First, as shown in FIGS. 21A and 21B, trenches 121 are formed in a substrate 120, and as shown in FIG. 21C, an epitaxial layer 122 of a desired dopant concentration is filled in the inside of each of the trenches 121. Accordingly, a profile in the depth direction is formed. In this processing method, substrate formation can be made by a trench forming step and an epitaxial growth step, and the number of steps is small and it is expected that throughput is improved. Further, since the shape of the doping layer is almost coincident with a trench shape, it is conceivable that an arbitrary shape with high aspect ratio can be formed as compared with the foregoing method of repeating the epitaxial growth and the dopant diffusion plural times.

However, as expected important problems in the case of trench filling epitaxial growth, void-less trench filling, defect-less epitaxial growth, and high controllability of doping concentration can be pointed out. On the other hand, in the present circumstances, a study of the trench filling epitaxial growth has not been sufficiently carried out, and proper measures against the problems and a manufacturing method are not clear.

Besides, there is a selective epitaxial method as an epitaxial growth technique similar to the trench filling epitaxial growth. The selective epitaxial method is a method in which as shown in FIGS. 22A and 22B, an oxide film 131 having opening portions 132 is disposed on a substrate 130, and as shown in FIG. 22C, epitaxial films 133 are grown only on portions where the surface of the silicon substrate 130 is exposed.

Thus, the structure in which the epitaxial films 133 are filled in the oxide film opening portions 132 is eventually obtained. The selective epitaxial technique has an object to form such a structure that the epitaxial films 133 are made device formation regions of CMOS and the oxide film 131 which is a mask is made element separation regions. Also in the selective epitaxial growth, void-less trench filling and defect-less epitaxial growth have been studied as the main technical problems.

SUMMARY OF THE INVENTION

The present invention has been made in view of the above problems. An object of the present invention is to provide a noble structure for a semiconductor substrate that has a semiconductor layer extending in a depth direction of the semiconductor substrate with a uniform concentration profile, and a method for manufacturing the same.

According to a first aspect of the present invention, a semiconductor substrate has a trench having a first width at a bottom thereof and a second width at an opening portion thereof larger than the first width. The trench is filled with a semiconductor layer having a dimension in a normal line direction with respect to a surface of the semiconductor substrate larger than a lateral dimension thereof that is a dimension in a lateral direction on an arbitrary plane parallel to the surface of the semiconductor substrate intersecting the trench.

According to a second aspect of the present invention, a semiconductor substrate has a semiconductor layer filled in a trench and having a dimension in a normal line direction with respect to a surface of the semiconductor substrate larger than a lateral dimension thereof that is a dimension in a lateral direction on an arbitrary plane parallel to the surface of the semiconductor substrate intersecting the trench. Further a conductive material is filled in the semiconductor layer in the trench for taking a potential of the semiconductor layer.

According to a third aspect of the present invention, a semiconductor substrate is manufactured by forming a trench in a semiconductor substrate; forming a first epitaxial layer on a surface of the semiconductor substrate and in the trench; etching a part of the first epitaxial film; and forming a second epitaxial film in the trench so that the trench is filled with the first and second epitaxial films.

According to a forth aspect of the present invention, a semiconductor substrate is manufactured by forming a trench; filling an amorphous semiconductor film in the trench; single-crystallizing the amorphous semiconductor film through a solid phase reaction; and flattening the surface of the semiconductor substrate.

According to a fifth aspect of the present invention, a semiconductor substrate is manufactured by forming a trench; forming an epitaxial film on a surface of the semiconductor substrate and in the trench; forming a conductive material film on the epitaxial film so that the conductive material film is filled in the epitaxial film in the trench; and flattening the surface of the semiconductor substrate.

According to a sixth aspect of the present invention, a semiconductor substrate is manufactured by forming a trench having a first depth in a semiconductor substrate; forming an epitaxial film on a surface of the semiconductor substrate and in the trench; and removing the epitaxial film on the surface of the semiconductor substrate, and a surface portion of the semiconductor substrate so that the trench has a second depth smaller than the first depth and is completely filled with the epitaxial film.

According to a seventh aspect of the present invention, when an epitaxial film is formed to fill a trench, a relation of $B/\alpha<F/2\beta$ is satisfied, in which:

$\alpha$ is a first growth rate of the epitaxial film on a bottom of the trench;

$\beta$ is a second growth rate of the epitaxial film on a side of the trench;

F is a width at an opening portion of the trench; and

B is a depth of the trench.

Thus, the present invention provides various constructions for a semiconductor substrate that has a semiconductor layer extending in an depth direction of the substrate with a uniform concentration profile with a high aspect ratio and a method for manufacturing the semiconductor substrate efficiently without generating any voids, crystal defects and the like.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS (First Embodiment)

Hereinafter, a first embodiment will be described with reference to FIGS. 1A–1D and 2A–2D.

First, a structure of a semiconductor substrate of this embodiment will be described. As shown in FIG. 2D, trenches 2 are formed in a silicon substrate (single crystal silicon substrate) 1 forming a semiconductor substrate, and the trenches 2 are filled with a single crystal silicon film 3. The single crystal silicon film 3 is formed by filling epitaxial growth. Here, the silicon substrate 1 is an N-type silicon substrate, and the single crystal silicon film 3 is a P-type doping layer. Thus, a PN junction is formed at an interface between the substrate 1 and the doping layer 3, and by this, it becomes possible to highly integrate a device in the depth direction. Hereinafter, the single crystal silicon film 3 is referred to as a doping layer. Incidentally, the conductivity types of the silicon substrate 1 and the doping layer 3 may be reversed (the substrate 1 has a P type, and the doping layer 3 has an N type). With respect to the size of the doping layer 3, a dimension B in a normal line direction to the surface of the substrate is larger than a dimension A in a lateral direction on an arbitrary plane parallel to the surface of the substrate intersecting the trenches 2. Further, the doping layer 3 is formed with an epitaxial layer filled in the trenches 2 to have a desired dopant concentration as described after, and has a concentration profile uniform in the depth direction.

Next, a method of manufacturing the semiconductor substrate will be described.

Figure 1A:
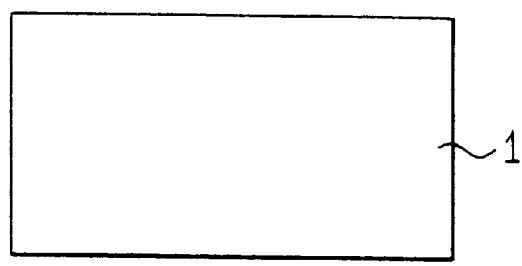
FIGS. 1A to 1D, and 2A to 2D are cross-sectional views each showing a semiconductor substrate in a stepwise manner for explaining a first preferred embodiment.
Figure 1B:
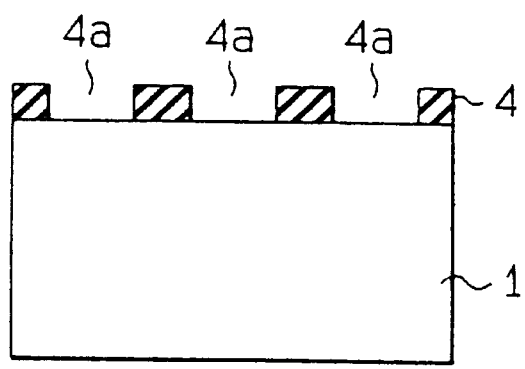

First, as shown in FIG. 1A, the single crystal silicon substrate 1 is prepared. Then, as shown in FIG. 1B, a silicon oxide film 4 which becomes an etching mask is formed on the upper surface of the single crystal silicon substrate 1, and after a resist material is applied, opening portions 4a are formed at desired regions by photolithography. That is, openings are made at trench processing positions. Although this oxide film etching may be dry etching or wet etching, the dry etching is desirable in view of performing high precision processing.

Figure 1C:
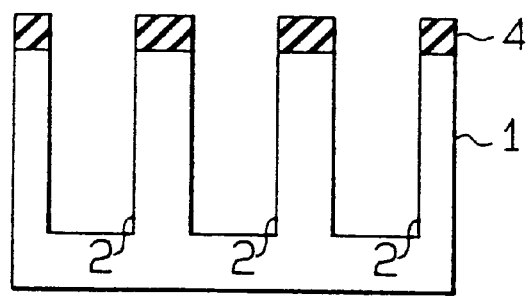

Further, as shown in FIG. 1C, the trenches 2 are formed in the single crystal silicon substrate 1 by using the silicon oxide film 4 as a mask and by carrying out anisotropic dry etching from the opening portions 4a. With respect to this dry etching, an RIE (Reactive Ion Etching) method generally used in a semiconductor process is used to etch the substrate silicon region in a vertical direction.

With respect to the trench processing, although the anisotropic etching process by the dry treatment is used, an anisotropic etching process by a wet treatment may be used. In the case where trench formation is made by the wet etching, a natural oxide film formed in the opening portion 4a of the oxide film 4 is previously removed by washing using an HF solution or the like, and thereafter, trench etching is carried out by a TMAH solution. The anisotropic etching by the TMAH solution uses such characteristics that an etching rate is different according to crystallographic plane orientations of the silicon substrate 1. Therefore, for the purpose of performing the trench processing with a higher aspect ratio, a Si (110) substrate is used, and a trench side is set to be a Si (111) plane, so that high aspect processing can be made with a selectivity (1:60) of the Si (111) plane and the Si (110) plane. As the etching solution, a KOH solution in addition to the TMAH solution can also be used.

Figure 1D:
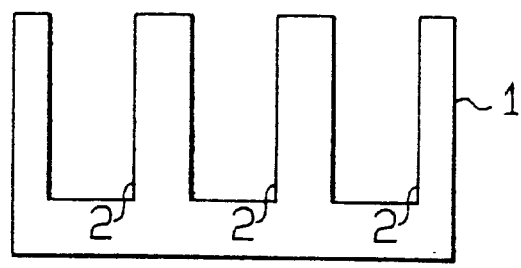
Figure 2A:
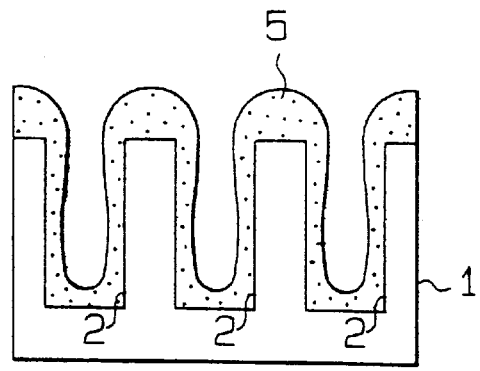
Figure 2B:
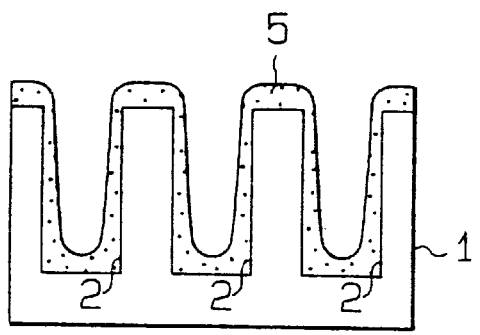

Subsequently, as shown in FIG. 1D, after the oxide film 4 used as the mask is removed, as shown in FIG. 2A, epitaxial growth is performed, so that an epitaxial film 5 is formed on the substrate 1 including the insides of the trenches 2 (the epitaxial film 5 for filling is formed in the insides of the trenches 2). In detail, prior to the film formation treatment, the surface of the substrate 1 including the insides of the trenches 2 is cleaned. As this cleaning treatment, it is effective to remove a natural oxide film by the HF solution. Here, in the case where trench formation is performed by dry etching, there is a case where reactive products adhere to the insides of the trenches. Therefore, in this case, it is effective to perform washing with sulfuric acid ($H_2SO_4$)+hydrogen peroxide water ($H_2O_2$) solution and thereafter to perform washing with the HF solution. In the washing with the HF solution, it is also possible to remove the mask oxide film 4 used for the trench formation, and FIG. 1D shows this case.

Further, it is preferable that after the washed substrate 1 is introduced in an LP-CVD chamber, a heat treatment is performed under a low pressure in hydrogen gas atmosphere, so that the natural oxide film on the surface of the substrate 1 is removed to further improve cleanness. As an example of the heat treatment conditions, vacuum pressure: 600 to 10 torr, $H_2$ flow rate: 20 to 50 liters/minute, substrate temperature: 800 to 1150° C. and treatment time: 1 to 10 minutes are used. Besides, in the film formation treatment of the epitaxial film 5, in the state where the surface of the substrate 1 is exposed to a film formation gas containing at least a film formation material element, the substrate 1 is kept at an arbitrary temperature (it is the same with film formation of other epitaxial films).

Figure 2C:
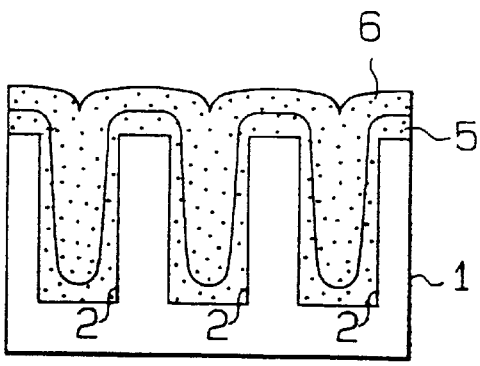
Figure 2D:
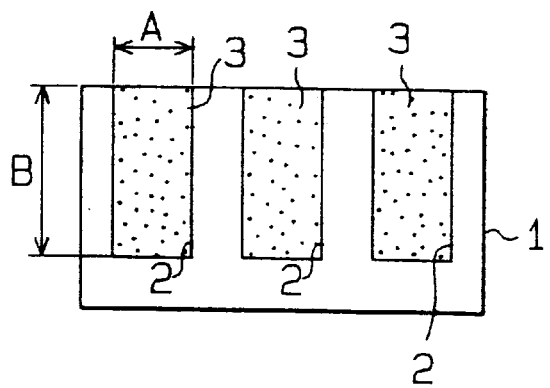
Figure 3:
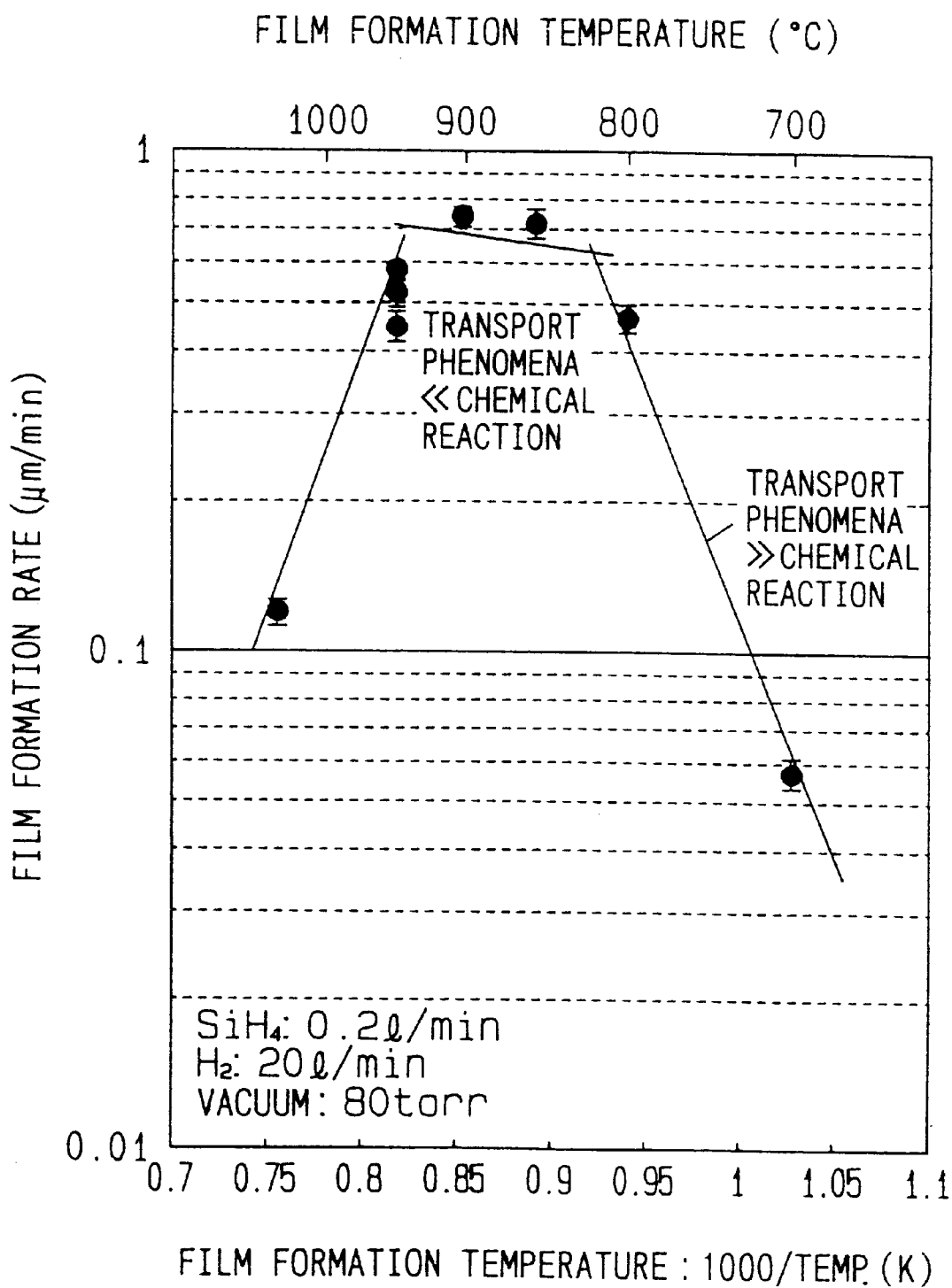
FIG. 3 is a graph showing a growth rate of an epitaxial film relative to a film formation temperature as an example.

Next, as shown in FIG. 2C, an epitaxial film 6 is formed. The film formation rate, which depends on the balance between gas transport phenomena and chemical reaction, could be controlled by a film formation temperature. The behavior of the film formation rate related with the formation temperature is shown in FIG. 3. For the void less filling process, it is desirable to select a lower temperature film formation condition (gas transport phenomena<<chemical reaction). However, the film formed by low temperature has a lot of crystal defects. Then, it is important to select the film formation temperature for trench filling epitaxial growth. An example of the film formation conditions is such that in the case where $SiH_4$ is used as a film forming gas, vacuum pressure: 600 to 10 torr, $H_2$ flow rate: 20 to 50 liters/minute, $SiH_4$ flow rate: 0.2 to 0.5 liter/minute, and substrate temperature: 700 to 1150° C. are used.

Although the epitaxial films 5 and 6 epitaxially grow from each bottom and side of the trenches 2, as the film thickness is increased, blocking of the opening portions of the trenchs 2 is apt to occur. Therefore, prior to the epitaxial growth of FIG. 2C, as shown in FIG. 2B, after the film formation of the epitaxial film 5, the epitaxial film 5 around the opening portions of the trenches 2 is etched by introduction of HCl gas. An example of film formation conditions is such that vacuum pressure: 600 to 10 torr, $H_2$ flow rate: 20 to 50 liters/minute, HCl flow rate: 0.5 to 1 liters/minute, and substrate temperature: 700 to 1150° C. are used.

At this time, since it is necessary to especially selectively etch the epitaxial film 5 around the opening portions and to decrease the etching amount of the epitaxial film 5 at the bottom of the trenches 2, etching under a higher temperature supply rate controlling condition is desirable. That is, in the etching treatment of the epitaxial film 5, the substrate 1 is kept at an arbitrary temperature at which the etching reaction becomes a supply rate controlling process in the state where the surface of the substrate 1 is exposed to at least the etching gas.

Figure 4:
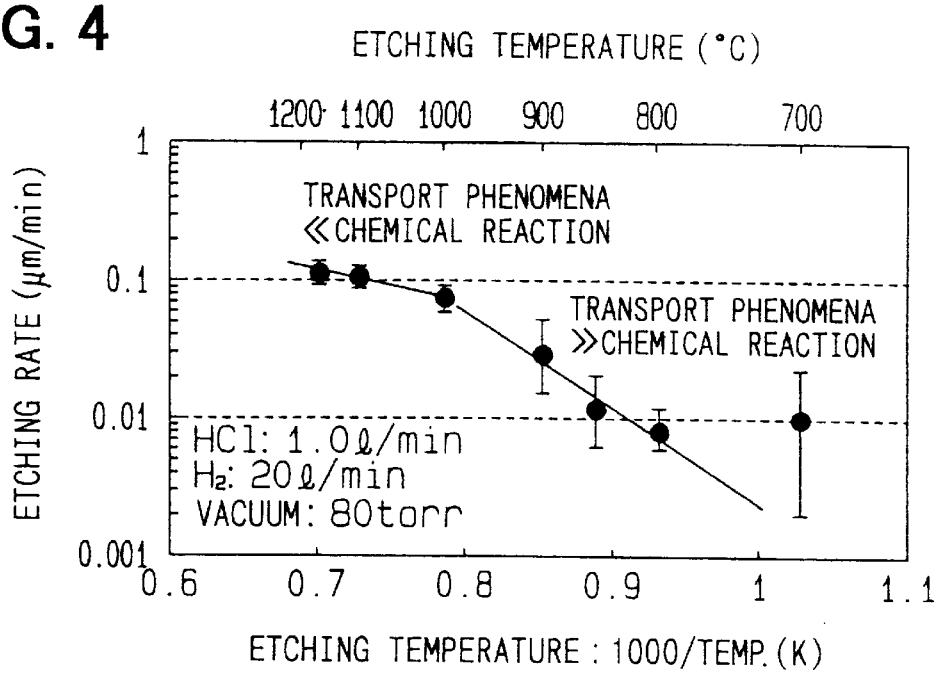
FIG. 4 is a graph showing an HCl etching rate relative to a substrate temperature as an example.

Specifically, as shown in FIG. 4, the etching rate, which also depends on the balance between gas transport phenomena and chemical reaction, could be controlled by a treatment temperature. For opening the blocked epitaxial layer, it is desirable to select a higher temperature etching condition (gas transport phenomena>>chemical reaction), e.g., 1100° C. or more. Further, the etching treatment carried out at a high temperature also has a merit that the etching rate is high and the throughput is improved. Besides, with respect to the etching of the opening portions, even when $H_2$ gas is used instead of HCl gas, $H_2$ gas has the etching action to the silicon film, and is desirable to use the high temperature condition (gas transport phenomena>>chemical reaction) similarly to the case of HCl etching. This etching treatment by HCl or $H_2$ can be performed by introducing gas into the LP-CVD chamber for forming the epitaxial film 5. Therefore, the improvement of throughput can be expected also from the point that the etching treatment can be made continuously with the film formation treatment.

Like this, after the epitaxial film 5 around the opening portions of the trenches 2 is etched, as shown in FIG. 2C, the epitaxial film 6 is formed. Accordingly, a filling property is improved. Incidentally, in the case where the trench opening portions are blocked and formation of voids occurs also in the second epitaxial growth, the HCl etching step for the epitaxial film 6 and the epitaxial growth step are again repeated to improve the filling property.

Then, after the filling epitaxial growth is performed, the surfaces of the epitaxial films 5 and 6 on the substrate 1 are flattened, and as shown in FIG. 2D, stepped portions remaining on the trenches 2 are removed. A CMP (Chemical Mechanical Polish) step is adopted for the flattening. In the CMP step, in addition to the flattening of the surface, there is also an effect to remove parts of the epitaxial film, having inferior crystallinity, in the vicinity of the respective trench opening portions. In addition to the CMP (polishing), flattening may be made by an etch-back method with a dry etching treatment.

The structure of the doping layer (doping layer extending in the depth direction) formed by the foregoing processing steps is different from that formed by a conventional method such as thermal diffusion from the surface. As shown in FIG. 2D, it is possible to form the doping layer 3 having a high aspect ratio which satisfies the relation that a ratio "B/A" of the dimension B of the extension in the normal line direction (depth direction) of the substrate surface to the dimension A of the lateral extension on an arbitrary plane parallel to the surface of the substrate intersecting the semiconductor layer (doping layer) 3 is larger than "1". By using the semiconductor substrate shown in FIG. 2D, for example, a high power MOSFET device as disclosed in U.S. Pat. No. 5,438,215 can be formed.

Like this, this embodiment has the features as follows:

After the trenches 2 are formed in the silicon substrate 1, the epitaxial film 5 is formed on the substrate 1 including the insides of the trenches 2 by the epitaxial growth method, and further, the etching treatment of a part of the epitaxial film 5 and the film formation treatment of the epitaxial film 6 are carried out once or plural times to fill the insides of the trenches 2 with the overlapped epitaxial films 5 and 6, and finally, the surfaces of the epitaxial films 5 and 6 on the substrate 1 are flattened.

Here, the epitaxial film 5 that is epitaxially grown in the trench first (directly) is referred to as a first epitaxial film, and the epitaxial film 6 that is epitaxially grown after the formation of the first epitaxial film is referred to as a second epitaxial film. In this case, the formation of the first epitaxial film, the etching of the part of the first epitaxial film around the opening portion, and the formation of the second epitaxial film are respectively performed at least once in this embodiment. However, after the formation of the second epitaxial film, etching of at least one of the first epitaxial film and the second epitaxial film narrowing the opening portion of the trench and the formation of the second epitaxial film may be repeated once or plural times to completely fill the trench with the first epitaxial film and the second epitaxial film without any voids.

Thus, by carrying out the etching treatment of the part of the epitaxial film 5, the opening portions of the trenches 2 are widened, and film formation of the epitaxial film 6 is performed in this state. Thus, blocking of the opening portions is suppressed and the voids can be reduced. Besides, because the etching treatment of the part of the epitaxial film 5 and the film formation treatment of the epitaxial film 6 are carried out plural times in accordance with the filled state, the filling property is further improved. Moreover, although stepped portions are produced on the surface of the substrate 1 after the trench filling epitaxial growth, a disadvantage in device formation in a subsequent step can be avoided by carrying out the flattening treatment.

In the etching treatment of the epitaxial film 5, the vapor phase etching action of hydrogen chloride or hydrogen is used in atmosphere containing hydrogen chloride or hydrogen. Thus, the chemical etching reaction of the silicon layer by hydrogen chloride or hydrogen is used for the etching treatment of the epitaxial film 5, so that a part blocking the opening portions can be removed at low damage.

Since the film formation treatment of the epitaxial film 5 and the etching treatment of the epitaxial film 5 are continuously carried out in the same film formation apparatus, the optimum substrate temperature in each treatment can be selected when the epitaxial growth and the etching treatment are continuously carried out.

Since the film formation treatment of the epitaxial film 5 and the etching treatment of the epitaxial film 5 are alternately carried out, in the etching reaction treatment with the gas material, the epitaxial film formation and the etching treatment can be continuously carried out in the film formation apparatus, adhesion of pollutants to the surface of the substrate can be reduced, and the throughput can be improved.

(Second Embodiment)

Next, a second embodiment will be described with reference to FIGS. 5A–5C and 6A–6C mainly on points different from the first embodiment.

Figure 6A:
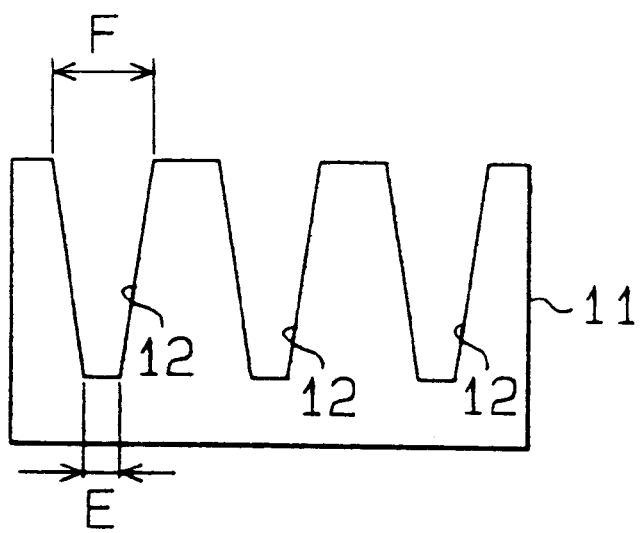
Figure 6B:
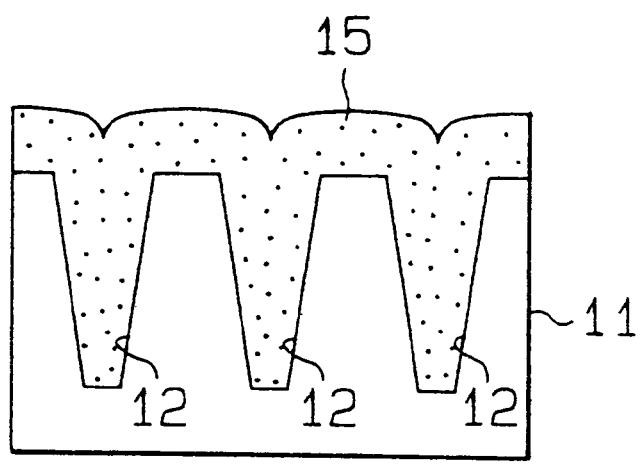
Figure 6C:
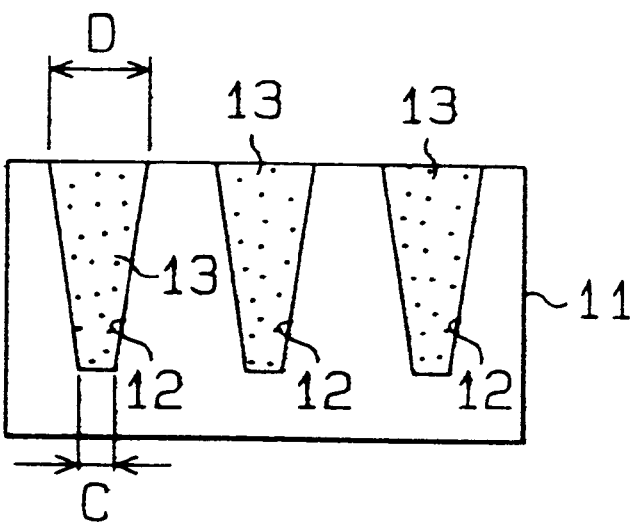
Figure 7A:
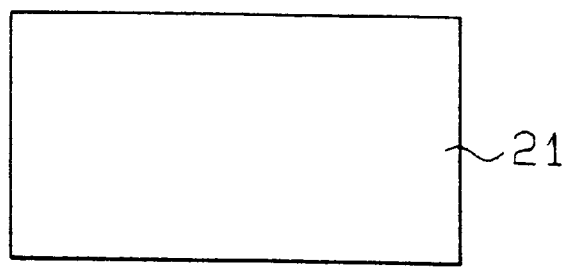
FIGS. 7A to 7D and 8A to 8C are cross-sectional views each showing a semiconductor substrate in a stepwise manner for explaining a third preferred embodiment.
Figure 7B:
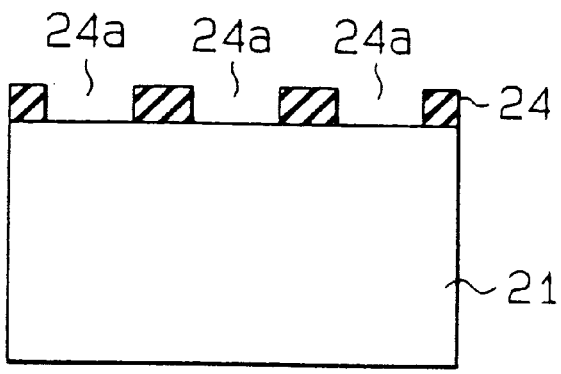
Figure 7C:
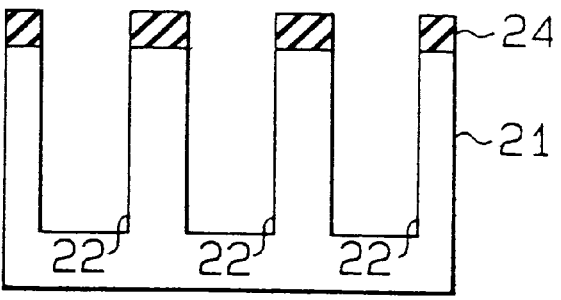
Figure 7D:
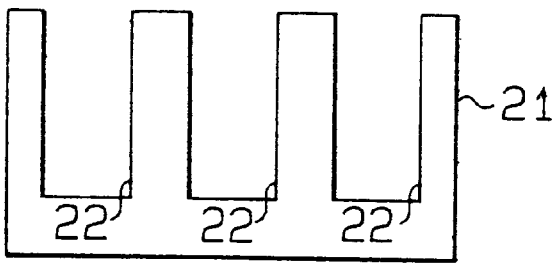

As shown in FIG. 6C, trenches 12 are formed in a silicon substrate (single crystal silicon substrate) 11 forming a semiconductor substrate, and a single crystal silicon film (doping layer) 13 is filled in the inside of each of the trenches 12. In this embodiment, for the purpose of suppressing voids forming when a filled epitaxial film 15 is grown in the insides of the trenches 12 in FIG. 6B, the shape of each trench 12 before the epitaxial growth is devised.

Figure 5A:
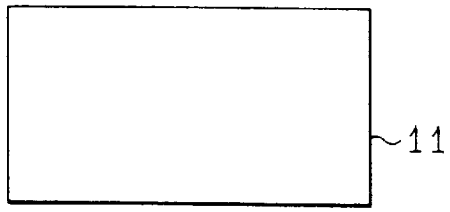
FIGS. 5A to 5C and 6A to 6C are cross-sectional views each showing a semiconductor substrate in a stepwise manner for explaining a second preferred embodiment.
Figure 5B:
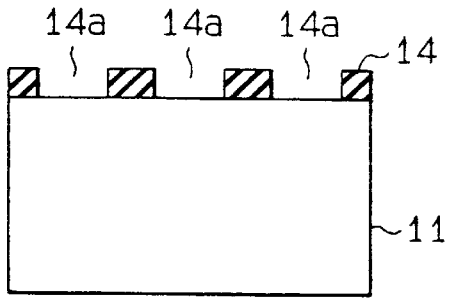
Figure 5C:
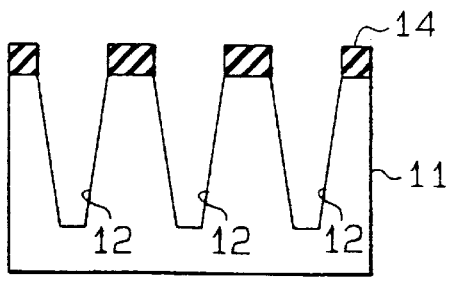

First, as shown in FIGS. 5A and 5B, an oxide film 14 having opening portions 14a is disposed on the silicon substrate 11. Then, as shown in FIG. 5C, the trenches 12 are processed to have a taper structure. Accordingly, as shown in FIG. 6A, the opening portion is widened relatively to the bottom of the trench 12 (F>E). In other words, such a trench shape is formed that a ratio (F/E) of an upper lateral dimension F of the trench 12 to a lateral dimension E at the bottom of the trench 12 is "1" or more. Accordingly, even if the thickness of a growth film at the bottom of the trench 12 is small as compared with the film growth thickness at the opening portion, it is possible to make the epitaxial film 15 grow at the bottom of the trench 12 before the opening portion is blocked as shown in FIG. 6B.

On the fabrication of the taper trench 12, since an aspect ratio of a trench is determined by the balance between a mechanical sputtering action by plasma in dry etching and an etching action by an isotropic chemical reaction by radicals, the forward taper processing can be performed by strengthening the isotropic etching action by the radicals.

After the film formation of the epitaxial film 15, as shown in FIG. 6C, the epitaxial film 15 is subjected to flattening treatment. In the single crystal silicon layer (doping layer) 13 formed in this way, since the structure at the trench processing is reflected, a ratio (D/C) of an upper lateral dimension D to a lateral dimension C at the bottom is "1" or more. That is, by making such trench shape that the ratio (F/E) of the lateral dimension of the upper portion to the lateral dimension of the bottom of the trench 12 is "1" or more, the aspect ratio of the semiconductor layer (doping layer) 13 can also be made "1" or more. Besides, even in the case where the trench 12 is subjected to the forward taper processing as in this embodiment, as described in the first embodiment, the film around the opening portion of the trench may be removed by HCl or H$_2$etching after filling epitaxial growth, so that the filling property can be improved further.

Like this, this embodiment has the features as follows:

The trench 12 having the width F at the opening portion larger than the width E at the bottom portion is formed in the silicon substrate 11, and the doping layer 13 having the dimension in the normal line direction of the surface of the substrate larger than the dimension in the lateral direction on an arbitrary plane parallel to the surface of the substrate intersecting the trench 12 is filled in the inside of the trench 12. Thus, while the aspect ratio (ratio of length to breadth) of the conventional doping layer (semiconductor layer) formed by thermal diffusion from the substrate surface or ion implantation region can not exceed "1" in principle, the semiconductor layer having a high aspect ratio exceeding 1 can be formed. As a result, the depth direction is effectively used and elements per unit area can be highly integrated.

Also, in the structure in which the lateral extension of the upper portion (substrate surface side) of the trench is made larger than that of the bottom (substrate deep side) of the trench, the filling property can be improved in formation of the doping layer 13 in the inside of the trench through the filling epitaxial growth. Incidentally, the semiconductor layer 13 in the trench 12 may be formed by doping layers of one or plural concentrations, or conductivity types different from one another.

(Third Embodiment)

Figure 8A:
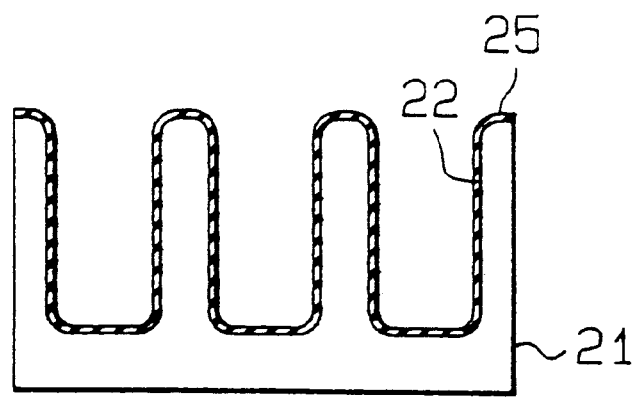
Figure 8B:
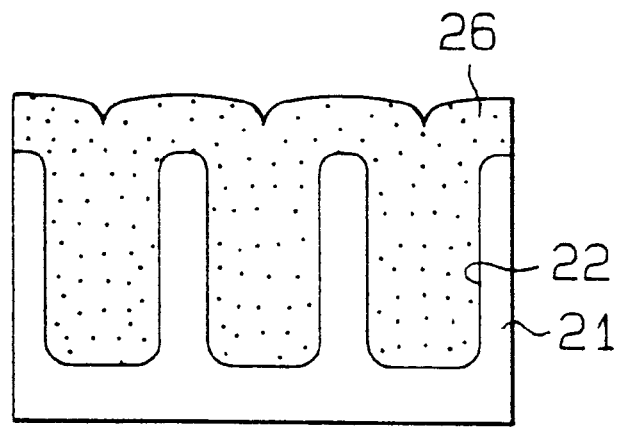
Figure 8C:
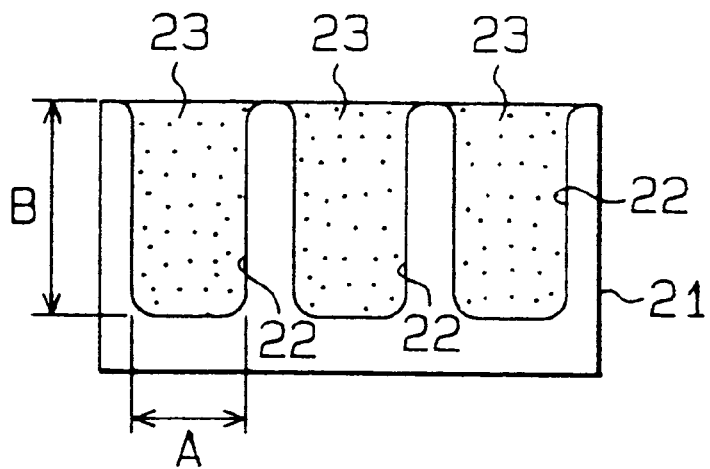

Next, a third embodiment will be described with reference to FIGS. 7A–7D and 8A–8C mainly on points different from the second embodiment. As shown in FIG. 8C, trenches 22 are formed in a silicon substrate (single crystal silicon substrate) 21 forming a semiconductor substrate, and a single crystal silicon film (doping layer) 23 is filled in the inside of each of the trenches 22. Also in this embodiment, for the purpose of reducing the voids when a filled epitaxial film 26 is grown in the inside of the trench 22, the shape of the trench 22 before the epitaxial growth is devised by a method different from the second embodiment.

Specifically, as shown in FIGS. 7A–7D, an oxide film 24 having opening portions 24a is disposed on the silicon substrate 21, and the trenches 22 are formed by a dry or wet treatment. Thereafter, as shown in FIG. 8A, the opening portion of each of the trenches 22 is rounded and oxidized by carrying out a high temperature thermal oxidation treatment. That is, the opening portion of the trench 22 is widened by formation of a thermal oxidation film 25. Especially, by making oxidation at an oxidation temperature of 1000° C. or more, preferably 1100° C. or more, the radius of curvature of the corner of the opening portion can be greatly rounded and oxidized, and the wide shape of the opening portion can be provided.

Then, the oxide film 25 is removed by etching treatment with an HF solution or the like. Accordingly, the trench 22 with the opening portion that is widened is exposed. Thereafter, as shown in FIG. 8B, a filling epitaxial growth treatment is carried out. At this time, the epitaxial film 26 can be grown at the bottom of the trench 22 before the opening portion of the trench 22 is blocked by the epitaxial film 26, and the voids are reduced.

Then, as shown in FIG. 8C, a flattening treatment of the epitaxial film 26 is carried out. Also in this embodiment, similarly to the first and second embodiments, the aspect ratio of the doping layer 23 can be made high, i.e., "1" or more. Besides, also in the case where the opening portion of the trench 22 is rounded and oxidized as in this embodiment, as described in the first embodiment, by combining the step of removing the blocking of the opening portion by HCl or H$_2$ etching after the filling epitaxial growth, the voids can be further reduced.

(Fourth Embodiment)

Next, a fourth embodiment will be described with reference to FIGS. 9A–9C mainly on points different from the first to third embodiments. In this embodiment, as trench shape control before epitaxial growth, an etching treatment is carried out to widen a trench opening portion of each of trenches 32, so that a wide and shallow trench 33 is formed at the opening portion of the trench 32.

Figure 9A:
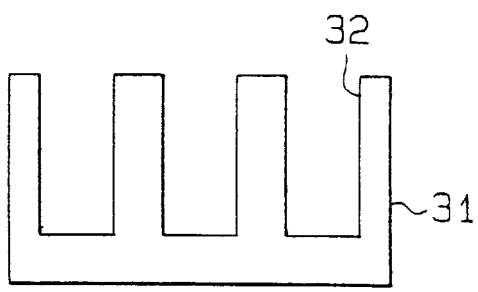
FIGS. 9A to 9C are cross-sectional views each showing a semiconductor substrate in a stepwise manner for explaining a fourth preferred embodiment.
Figure 9B:
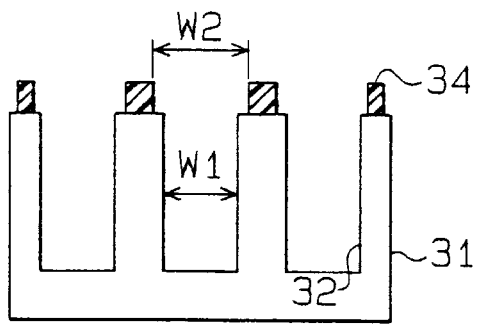

First, as shown in FIG. 9A, trench etching is carried out in conformity with a desired diffusion shape, and the trench 32 is formed. A mask oxide film is removed. Then, as shown in FIG. 9B, a mask 34 of a resist or the like is again formed by photolithography. The mask 34 has an opening wider than a trench opening width W1 of the trench 32. That is, the opening width W2 of the mask 34 is larger than the trench opening width W1.

Figure 9C:
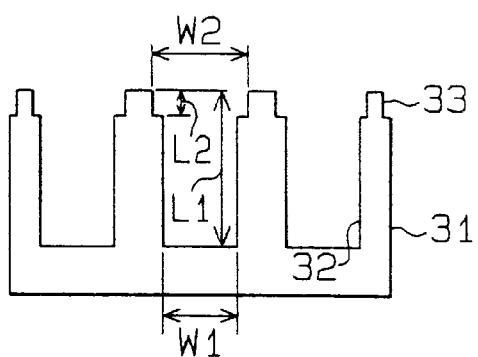

Further, a dry etching treatment is carried out with the resist mask 34, and as shown in FIG. 9C, etching of the trench opening portion (trench upper portion) is carried out. As a result, the trench 33 for widening the opening portion of the trench 32 is formed. Thus, in filling epitaxial film formation of a subsequent step, it is possible to suppress blocking of the opening portion and to reduce the voids.

Here, with respect to the size of the formation region of the trench 33, it is necessary that the width W2 is made wider than the opening width W1 of the trench 32, and a depth L2 is made shallower than a depth L1 of the trench 32. Incidentally, the etching treatment (formation of the trench 33) of the opening portion may be carried out before the processing step of the trench 32. In this case, after the etching treatment (formation of the trench 33) of the opening portion is carried out with a resist mask or oxide film mask, a trench processing pattern is again formed by an oxide film mask or resist mask, and the etching treatment for forming the trench 32 is carried out. With respect to the number of times of etching treatment to the trench upper portion, the treatment may be carried out plural times before or after the trench 32 is formed on the substrate 31.

(Fifth Embodiment)

Next, a fifth embodiment will be described mainly on points different from the first to fourth embodiments.

Figure 10:
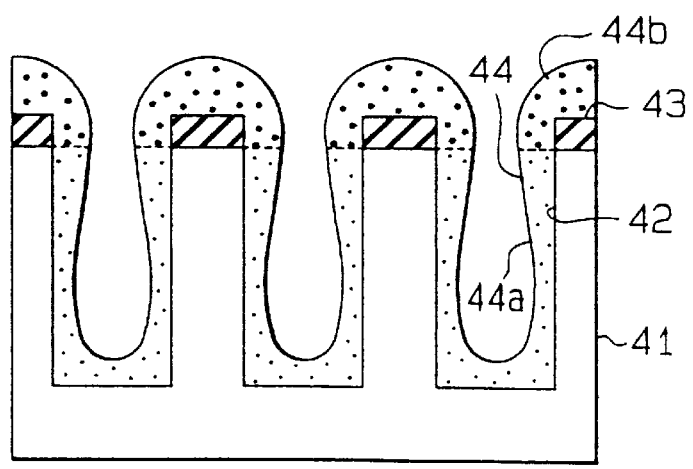
FIG. 10 is a cross-sectional view showing a semiconductor substrate for explaining a fifth preferred embodiment.

As shown in FIG. 10, in this embodiment, trenches 42 are formed in a silicon substrate 41. At this time, an oxide film 43 as an etching mask of the trenches 42 is made to remain. In this state, an epitaxial film 44 is formed by epitaxial growth. That is, the epitaxial film 44 is formed in the state where all or a part of the film 43 used as the etching mask in the trench formation step of the previous step remains. In this case, single crystal silicon 44a grows on the side wall of each of the trenches 42, while a film of polycrystalline silicon 44b is formed on the upper portion of the oxide film 43 since information of atomic position of the substrate 41 cannot be obtained on the oxide film 43. The epitaxial film 44 capable of blocking the opening portion of the trench 42 receives the influence of polycrystalline silicon growing in the lateral direction from the oxide film 43 and becomes polycrystalline silicon (more particularly, it becomes a poor crystallinity film in which a polycrystalline region and a single crystal region are mixed).

In such a state, etching is carried out while introducing HCl or H$_2$ gas. Then, since the polycrystalline silicon 44*b* has an etching rate larger than that of single crystal silicon, the etching rate of the epitaxial film 44*b* at the opening portion having the poor crystallinity is large as compared with the epitaxial film 44*a* of excellent crystallinity at the bottom of the trench 42. As a result, selective etching of the epitaxial film 44 around the opening portion can be easily carried out. That is, the polycrystalline silicon around the trench opening portion can be selectively removed.

Like this, when the epitaxial growth is carried out in the state where the oxide film mask 43 remains, the selective etching treatment of the trench opening portion using HCl or H$_2$ can be more effectively carried out (selective etching property of the opening portion can be raised). Incidentally, as the material of the mask, a nitride film may be used instead of the oxide film. Since polycrystalline silicon grows also on the nitride film, the same effect as the oxide film can be obtained.

Further, in a CMP step for flattening the surface of the epitaxial film after filling epitaxial growth, processing accuracy can be improved by using the oxide film 43 used as the etching mask in the trench formation as a stop point detection film of polishing (polishing stopper). That is, such a characteristic is used that since the polishing rate of the oxide film is low as compared with the silicon film, polishing is stopped at the point when the oxide film 43 is exposed. Similarly, also in the case where surface flattening of the epitaxial film is carried out by etch-back with a dry etching treatment, the oxide film used as the etching mask may be used as an etching stopper.

Incidentally, as described above, at the epitaxial film formation, single crystal semiconductor may be formed on the trench opening portion and the flat portion by forming the epitaxial film 44 in the state where all of the film 43 used as the etching mask of the trench formation step of the previous step is removed. Accordingly, the crystallinity of the epitaxial film around the trench opening portion is improved.

(Sixth Embodiment)

Next, a sixth embodiment will be described with reference to FIGS. 11A–11D mainly on points different from the first to fifth embodiments. As shown in FIG. 11D, in this embodiment, trenches 52 are formed in a silicon substrate (single crystal silicon substrate) 51 forming a semiconductor substrate, and a single crystal silicon film (doping layer) 53 is filled in the inside of each of the trenches 52.

Figure 11A:
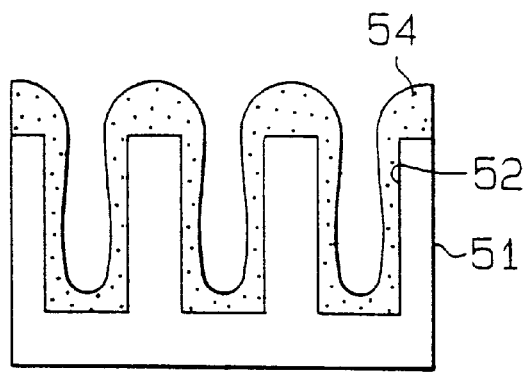
FIGS. 11A to 11D are cross-sectional views each showing a semiconductor substrate in a stepwise manner for explaining a sixth preferred embodiment.

Specifically, first, as shown in FIG. 11A, the trench 52 with a desired depth is formed at a desired position of the silicon substrate 51 where the doping layer is to be formed. In this trench formation step, an anisotropic etching treatment of a dry etching treatment or wet etching treatment is carried out. Thereafter, filling epitaxial growth is carried out (epitaxial film 54 is formed) on the substrate 1 including the inside of the trench 52. At this time, the filling epitaxial layer mainly growns on the side of the trench 52. As a result, in the case where growth ends from sides opposite to each other come in contact with each other at the center of the trench, even if macroscopically appearing voids can be reduced through the first to fourth embodiments, lattice unconformity in an atomic level occurs and becomes the cause of crystal defects.

Figure 11B:
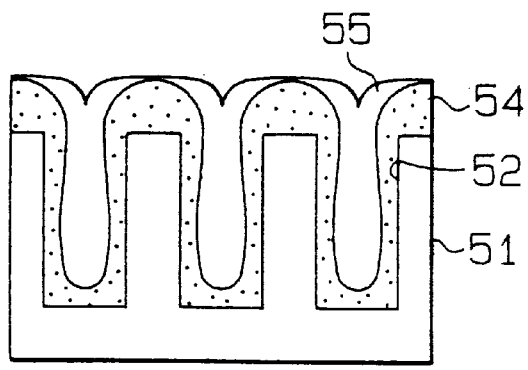

Therefore, in this embodiment, as shown in FIG. 11A, filling epitaxial growth is made in the inside of the trench 52. Then, as shown in FIG. 11B, an amorphous silicon film 55 is formed on the substrate 1 including the inside of the trench 52 in the state where "voids" exist at the center portion of the trench 52 and is filled in the inside of the trench 52. The amorphous silicon film 55 is formed in an LP-CVD apparatus in which SiH$_4$ is used as a film forming gas, H$_2$ is used as a carrier gas, and film formation is made at a low temperature of 600° C. or less. Since the film formation is made at a low temperature, the filling property is excellent and filling can be made even in the "voids" existing at the center portion of the trench.

Figure 11C:
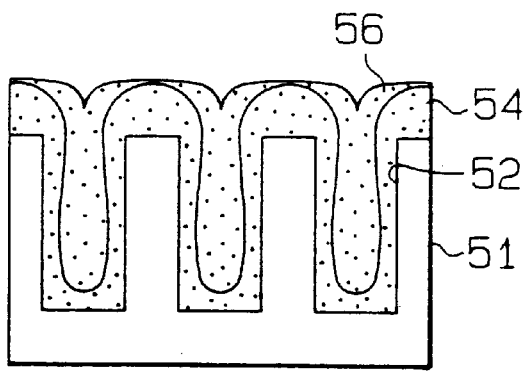
Figure 11D:
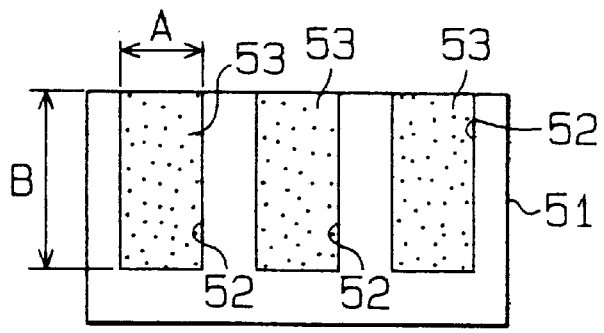
Figure 12A:
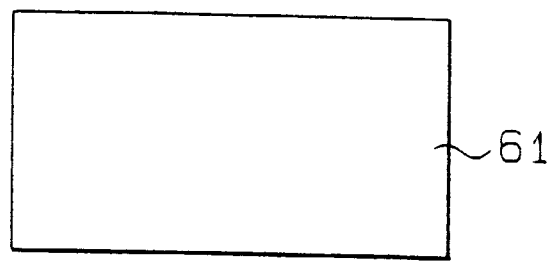
FIGS. 12A to 12D and 13A to 13C are cross-sectional views each showing a semiconductor substrate in a stepwise manner for explaining a seventh preferred embodiment.
Figure 12B:
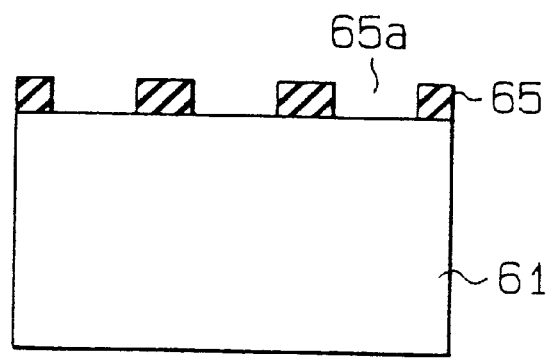
Figure 12C:
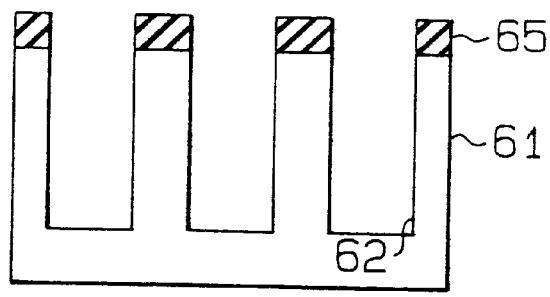
Figure 12D:
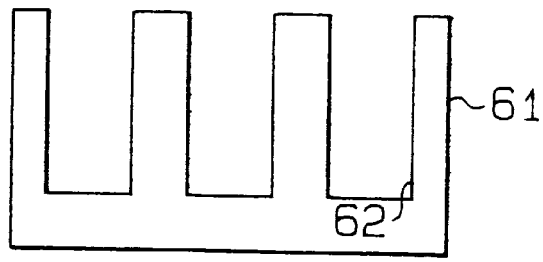

Subsequently, as shown in FIG. 11C, a solid reaction is induced by a heat treatment in the LP-CVD apparatus, and the filled amorphous silicon layer 55 is single-crystallized (transformed into a single crystal silicon film 56). At this time, there is a fear that when the vapor phase reaction occurs from both sides of the trench 52, a defect layer can be produced at the center portion of the trench. However, even in such a case, the crystal defect layer at the center portion of the trench is thermally relaxed at the time of the solid phase reaction (the time of single-crystallization). Here, a heat treatment at 900° C. or more, preferably 1100° C. or more is required for causing the solid phase reaction.

Besides, the heat treatment for the solid phase reaction is not limited to the treatment performed in a reduced pressure atmosphere in the LP-CVD apparatus, but it maybe a heat treatment performed under the atmospheric pressure using an electric furnace or the like after taking out to the outside of the film formation apparatus. However, when it is carried out in the LP-CVD apparatus, a series of treatments can be performed in the same apparatus, so that a treatment time can be saved and the improvement of throughput can be expected. Then, as shown in FIG. 11D, a flattening treatment os carried out to flatten the surfaces of the films 54 and 56.

Incidentally, in this embodiment, although the amorphous layer 55 is formed to be filled in the trench 52 after the epitaxial film 54 is formed, trench filling can be made by only the amorphous silicon layer 55 without using the epitaxial film 54. However, since a film formation rate is small, in the case where only amorphous silicon is filled in the inside of the trench, the film formation treatment necessitates a long time. Besides, also in this embodiment, similarly to the first to fourth embodiments, high aspect doping layer processing for attaining an aspect ratio of "1" or more may be carried out (effects obtained by doing so will be later set forth together).

Like this, this embodiment has the features as follows:

The trenches 52 are formed in the silicon substrate 51, and the amorphous silicon film 55 is formed on the substrate 51 including the trenches 52 and is filled in the inside of each of the trenches 52. Further, the amorphous silicon film 55 is subjected to the solid phase reaction by the heat treatment to be single-crystallized, and next, the surface of the single crystal silicon film 56 on the substrate 51 is flattened. Since the film formation of the amorphous silicon film 55 is carried out at a low temperature, the filling property is excellent.

Besides, although there is a fear that a defect layer is produced at the center portion of the trench when the vapor phase reaction is made from both sides of the trench 52, it is expected that heat relaxation occurs when amorphous silicon is single-crystallized through the solid phase reaction. Therefore, the trench 52 can be filled with excellent single crystal film. Further, although stepped portions are produced on the substrate surface after the amorphous silicon film 55 is formed, disadvantages in device formation of a subsequent step can be avoided by carrying out the flattening treatment.

When the width of the trench 52 at the opening portion (substrate surface side) is larger than the width at the bottom portion (substrate deep side), eventually, it becomes possible to improve the filling property of the amorphous silicon film 55. For example, in the trench formation step, when the thermal oxidation treatment is carried out after the trench etching treatment is carried out and the trench opening portion is widened by removing the formed oxide film, the filling property of the amorphous silicon film 55 can be improved.

In the trench formation step, when the etching treatment is carried out once or plural times to the trench upper portion before or after the trench etching treatment is carried out, a trench opening portion is widened desirably by the etching treatment, so that the filling property of the amorphous silicon film 55 can be improved. In the etching treatment to the upper portion of the trench 52, the width of the opening portion is made larger than the width of the bottom of the trench 52, and the etching depth is made smaller than the depth of the trench 52.

In the case where only the amorphous silicon film 55 is filled without the epitaxial film 54, since the growth rate of amorphous silicon is low, there is a fear that the throughput is lowered. However, in this embodiment, the amorphous silicon film 55 has only to be completely filled after the epitaxial film 54 is formed by vapor phase growth, and the amorphous silicon film 55 has only to be formed at the final stage of filling. For that reason, the throughput is improved and it becomes possible to suppress the voids of the center portion of the trench and crystal defects.

When the film formation of the epitaxial film 54 and the film formation of the amorphous silicon film 55 are continuously performed in the same film formation apparatus, adhesion of pollutants to the surface of the substrate can be reduced and the throughput is also improved.

After the epitaxial film 54 is formed in the inside of the trench 52, the etching treatment of the epitaxial film 54 and the film formation treatment of the epitaxial film can be repeated once or plural times. Like this, the etching treatment for removing a part blocking the opening portion is carried out after the epitaxial film is filled, and the epitaxial film is further formed. Accordingly, blocking of the opening portion by the epitaxial film filled is reduced, and the filling property at the film formation step of the epitaxial film is improved so that the voids can be suppressed.

Here, in the etching treatment of the epitaxial film 54, when the vapor phase etching action of hydrogen chloride or hydrogen is used in an atmosphere containing hydrogen chloride or hydrogen, it is possible to remove the part blocking the opening portion at low damage.

By alternately carrying out the film formation treatment of the epitaxial film 54 and the etching treatment of the epitaxial film 54, it becomes possible to select the optimum substrate temperature in each treatment in continuously carrying out the epitaxial growth and the etching treatment. Besides, since the epitaxial film formation and the etching treatment can be continuously carried out in the film formation apparatus, particularly the etching reaction treatment with a gas material can reduce adhesion of pollutants to the surface of the substrate and improve throughput.

In the film formation treatment of the epitaxial film 54, the substrate is kept at an arbitrary temperature in the state where the surface of the substrate is exposed to a film formation gas containing at least a film formation material element. In the etching treatment of the epitaxial film 54, in the state where the surface of the substrate 51 is exposed to at least an etching gas, the substrate is kept at an arbitrary temperature at which the etching reaction becomes the supply rate controlling reaction. That is, in the etching treatment, since it is desirable to selectively etch the opening portion, it is effective to carry out the etching treatment at a high temperature at which supply rate controlling is obtained.

When the polycrystalline silicon is formed at the trench opening portion by forming the epitaxial film 54 in the state where all or a part of the film used as the etching mask in the trench formation step as the previous step remains, and when the polycrystalline silicon at the trench opening portion is selectively removed in the etching treatment, it is possible to selectively remove only the opening portion. Alternatively, when the epitaxial film is formed, by forming the epitaxial film 54 in the state where all of the film used as the etching mask in the trench formation step as the previous step is removed, single crystal semiconductor may be formed on the trench opening portion and the flat portion. As a result, the crystallinity of the epitaxial film of the trench opening portion is improved.

Besides, as another feature, in the solid phase reaction step for single-crystallizing amorphous silicon, by continuously carry out the heat treatment in the same film formation apparatus as the filling step of the amorphous silicon film 55, adhesion of pollutants to the surface of the substrate can be reduced, and the throughput is also improved. Besides, when flattening of the surfaces of the films 54 and 56 is carried out by the etch-back method with the dry etching treatment, the film used as the etching mask can be made a polishing stopper or stopper of dry etching, so that processing accuracy in flattening of the surface can be improved.

(Seventh Embodiment)

Next, a seventh embodiment will be described with reference to FIGS. 12A–12D and 13A–13D mainly on points different from the first to sixth embodiments.

Figure 13A:
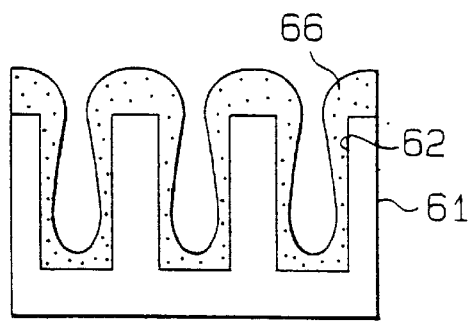
Figure 13B:
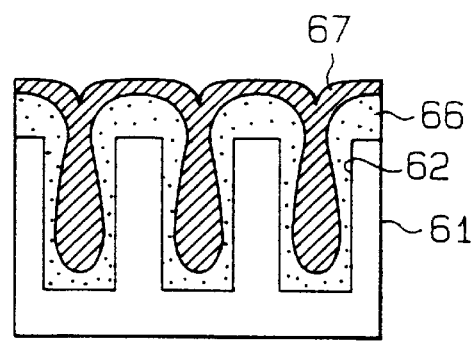
Figure 13C:
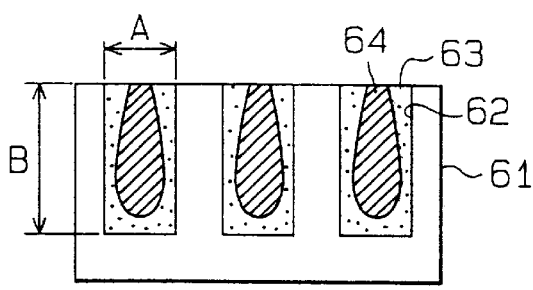

As shown in FIG. 13C, trenches 62 are formed in a silicon substrate (single crystal silicon substrate) 61 forming a semiconductor substrate. A single crystal silicon film (doping layer) 63 is filled in the inside of each of the trenches 62, and a conductive material 64 is filled in the inside thereof. The conductive material 64 is disposed for taking a potential of the doping layer 63. Besides, the substrate 61 has an N type, and the doping layer 63 has a P type (alternatively, the substrate 1 has the P type, and the doping layer 63 has the N type). Therefore, a PN junction is formed at the interface between the substrate 61 and the doping layer 63, and it is possible to highly integrate a device in the depth direction.

First, as shown in FIGS. 12A–12D, etching is carried out to the silicon substrate 61 from an opening portion 65a of an oxide film 65 to form the trench 62 at a desired depth and at a desired position where the doping layer is to be formed. As the etching, a dry or wet anisotropic etching treatment is adopted. The processing step of the trench 62 so far is the same as the first embodiment.

Then, as shown in FIG. 13A, an epitaxial film 66 is formed by an epitaxial growth method on the substrate 61 including the inside of the trench 62. In the growth step of the epitaxial film 66, in order to fill the conductive material 64 in the trench 62 in a subsequent step, the epitaxial film 66 is grown at the inside of the trench 62 and is not completely filled in the trench 62.

Thereafter, as shown in FIG. 13B, a film (conductive film) 67 made of a conductive material is formed on the epitaxial film 66, and fills the trench 62 with the epitaxial film 66 interposed there between. As the conductive material for the film 64 to be filled, a metal material (metal film) generally used as a wiring material, specifically, Al, Cu or the like is used. Incidentally, it is possible to prevent migration of Al or Cu by forming a film of a material such as TiN, which becomes barrier metal, in the inside of the trench in advance. With respect to Al, film formation can be made by a PVD method such as sputtering or evaporation or a CVD method, and in order to improve the filling property and crystallinity, it is desirable to carry out a heat treatment at about 600° C. after the film formation. With respect to Cu, film formation is made by a Cu plating method or the like.

As another conductive material, it is also possible to fill metal silicide as a compound of metal and silicon into the trench. As a metal material forming metal silicide, Ti, Co, Ni, W, Pd, Pt or the like can be used, and any material is deposited in the trench 62 by the PVD method such as sputtering or evaporation, and is made to react with a part of the epitaxial film 66 by a subsequent heat treatment (300 to 900° C.) to make silicide. Since a net volume is increased by transforming the metal layer into silicide, consequently, it becomes possible to completely fill the layers in the inside of the trench 62. With respect to the film formation of the metal silicide layer, the film formation can also be made by the CVD method using a gas material containing a metal silicide material. Since metal silicide is chemically stable, the reliability is high, and since electric conductivity is almost equal to that of metal, it is preferable to use it as a conductive material for taking a potential of the doping layer.

Further, polycrystalline silicon of high impurity concentration (polycrystalline semiconductor material of high concentration) may be used as the conductive material. In this case, a gas material as a dopant and a film formation material are introduced by the CVD method and film formation is made in the trench. In this method, it becomes possible to continuously form films in the epitaxial growth apparatus. Incidentally, in this case, it is necessary to make the conductivity type of the epitaxial film 66 coincident with the conductivity type of the polycrystalline silicon. Besides, in the film formation step of the epitaxial film 66 and the film formation step of the conductive film 67, it is appropriate that the etching treatment of the opening portion by HCl or $H_2$ used in the first embodiment or the like is added to prevent the formation of voids.

Thus, at least one of metal materials, metal silicide materials, and polycrystalline semiconductor materials of high concentration should be used as the conductive material for filling. By adopting these materials, a conductive material layer, which has excellent electrical conductivity and is also chemically stable, can be formed. When high concentration polycrystalline silicon of the same conductivity type as the conductivity type of the doping layer 63 is selected as the conductive material, contact resistance of the doping layer 63 can be lowered.

Then, as shown in FIG. 13C, the surfaces of the epitaxial film 66 and the conductive film 67 on the substrate 61 are flattened by polishing to eliminate stepped portions due to film growth, and disadvantages at device formation in a subsequent step are avoided. As a result, the doping layer 63 having a high aspect ratio and holding the built-in conductive material 64 is formed. That is, the doping layer 63, in which its dimension in the normal line direction of the substrate surface is larger than its dimension in the lateral direction on an arbitrary plane parallel to the substrate surface intersecting the trench 62, is filled in the trench 62. Thus, while the aspect ratio of the conventional doping layer formed by the thermal diffusion from the substrate surface or ion implantation region can not exceed "1" in principle, the semiconductor layer (doping layer) in this embodiment can have a high aspect, so that effective use in the depth direction is achieved and it becomes possible to highly integrate elements per unit area.

Besides, by filling the conductive material 64 in the doping layer 63, as compared with the case where a wiring line is connected to the surface of the doping layer 63 (as compared with the case where a potential is taken from the surface), it becomes possible to spread an electric field uniformly in the doping layer 63, and it is possible to lower a parasitic resistance between the doping layer 63 and the wiring line. Particularly, this is effective in the case where the trench depth is made deeper and the doping layer is formed with a higher aspect ratio.

(Eighth Embodiment)

Next, an eighth embodiment will be described with reference to FIGS. 14A and 14B mainly on points different from the first to seventh embodiments. As shown in FIG. 14B, trenches 72 are formed in a silicon substrate (single crystal silicon substrate) 71 forming a semiconductor substrate, and a single crystal silicon film (doping layer) 73 is filled in the inside of each of the trenches 72.

Figure 14A:
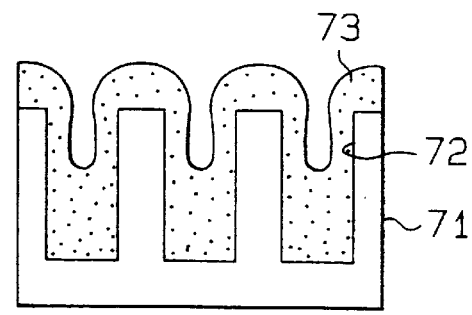
FIGS. 14A and 14B are cross-sectional views each showing a semiconductor substrate in a stepwise manner for explaining an eighth preferred embodiment.
Figure 14B:
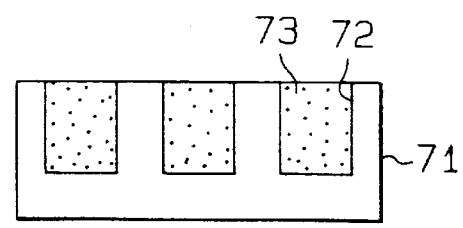

First, as shown in FIG. 14A, after the trench 72 is formed in the silicon substrate 71, an epitaxial film 73 is formed on the substrate 1 including the inside of the trench 72 by an epitaxial growth method. At this time, even in the state where a void remains at the upper portion of the trench 72, as shown in FIG. 14B, the void region is removed by a polishing treatment from the surface to the depth where the void does not exist. That is, polishing is performed from the surface of the epitaxial film 73 on the substrate 71 to remove the epitaxial film 73 and the substrate 71 to at least the position deeper than the opening portion of the trench 72. Thus, even if the "void" at the film formation of the epitaxial film 73 is produced around at least the opening portion of the trench 72, the "void" can be removed by the polishing treatment. In addition, the surface is flattened by this polishing treatment, and disadvantages in device formation of a subsequent step can be avoided. In this way, it is possible to finally provide the doping layer 73 with an excellent filling property.

This method can be applied as a poor filling removing method for the upper portion of the trench also in the case shown in the sixth embodiment where the amorphous silicon is filled and is single-crystallized and also in the case shown in the seventh embodiment where the epitaxial film and the conductive material are filled.

Here, dopant concentration control of the doping layer will be described in the aforementioned embodiments.

The first to eighth embodiments are designed such that the filled epitaxial film (including the amorphous film 55) is formed in the trench so that the three-dimensional doping layer is formed. When the doping layer is formed, the dopant concentration control of the filled layer is necessary. In mixing of a dopant (introduction of a gas material containing an impurity which becomes the dopant), at the film formation step of the epitaxial film, a gas of $B_2H_6$ or the like is introduced at about 0.1 to 0.5 liter/minute so that B (boron) is mixed in the epitaxial film in the case where a P-type layer is formed. In the case where an N-type layer is formed, a gas of $PH_3$ or the like is introduced at about 0.1 to 0.5 liter/minute so that P (phosphorus) is mixed in the epitaxial film.

(Ninth Embodiment)

Next, a ninth embodiment will be described mainly on points different from the first and sixth embodiments. In this embodiment, a heat treatment is carried out under reduced pressure in a non-oxidation atmosphere as a countermeasure to the poor filling of the trench center portion in the case where filling epitaxial growth is made in the inside of the trench as in the first embodiment. Accordingly, the movement of silicon atoms is accelerated while oxidation of the surface is prevented. Thus, silicon atoms on the surface of the void are rearranged, and as a result, the void can be reduced.

As step conditions (non-oxidation heat treatment under reduced pressure), a treatment temperature is set to 950° C. to 1200° C. (especially, it is more effective to set the temperature to 1100° C. or more), a time period is set to 1 to 20 minutes, and an atmosphere is made vacuum or a low pressure atmosphere (10 to 300 torr) in which $H_2$ or rare gas (He, Ar, etc.) is introduced.

More specifically, this embodiment is applied to a comparative example including steps of trench etching→HF washing (removal of natural oxide film)→heat treatment (removal of natural oxide film)→epitaxial film formation→HCl etching→re-epitaxial film formation (improvement of filling property by low temperature film formation)→primary polishing→sacrificial oxidation→finish polishing. That is, this embodiment performs steps of trench etching→HF washing (removal of natural oxide film)→heat treatment (removal of natural oxide film)→epitaxial film formation→HCl etching→re-epitaxial film formation (improvement of filling property by low temperature film formation)→non-oxidation heat treatment under reduced pressure→primary polishing→sacrificial oxidation→finish polishing.

Figure 15A:
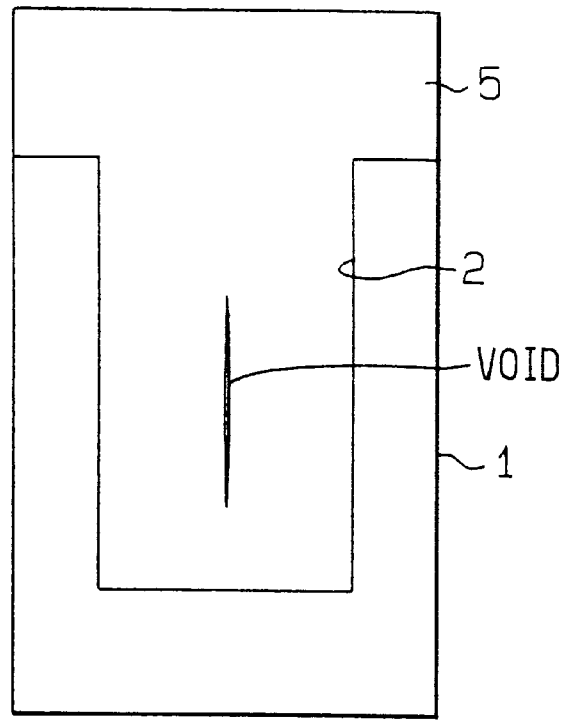
FIGS. 15A and 15B are cross-sectional views showing semiconductor substrates, for explaining a ninth preferred embodiment.
Figure 15B:
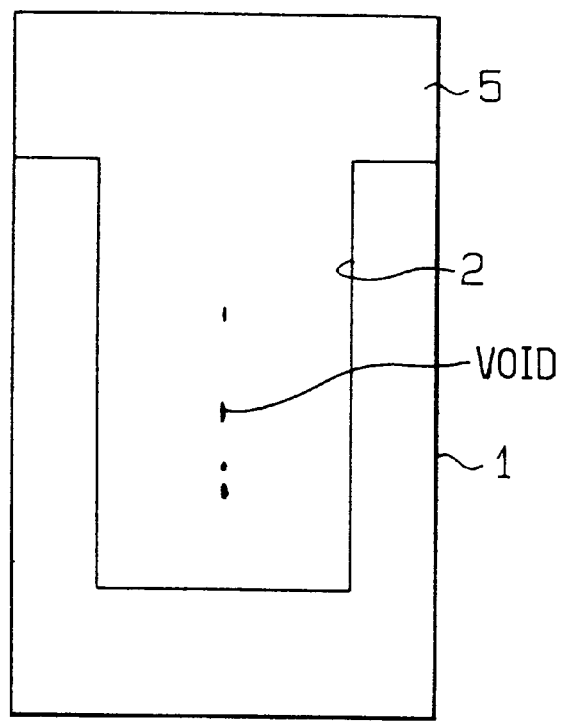

FIGS. 15A and 15B are vertical sectional views schematically showing epitaxial film states when effects by a heat treatment performed in the non-oxidation reduced pressure atmosphere were ascertained. First, as shown in FIG. 15A, an epitaxial film 5 was formed in a trench 2 of a substrate 1. Then, a heat treatment of $H_2$, 1150° C., 10 minutes and 80 torr was carried out. As a result, as shown in FIG. 15B, the void was reduced.

In detail, the void in FIG. 15A extends linearly in the trench depth direction at the center of the trench. By carrying out the foregoing heat treatment from this state, silicon atoms moves and are rearranged on the plane (inner peripheral surface of void) exposed at the surface of the void. Accordingly, both surfaces of the void are bonded with each other, so that the void is reduced. As a result, as shown in FIG. 15B, the void becomes points from a line.

Like this, as the method of manufacturing a semiconductor substrate, when the epitaxial film is formed, after it is filled in the inside of the trench, the heat treatment is carried out in the non-oxidation low pressure atmosphere. Accordingly, the void can be suppressed. Especially, when the heat treatment in the non-oxidation low pressure atmosphere is continuously carried out subsequent to epitaxial film formation in the same film formation apparatus in which the epitaxial film formation is carried out, adhesion of pollutants to the surface of the substrate can be reduced and the throughput is also improved. This method can be applied to the sixth embodiment in addition to the first embodiment. That is, in the step of single-crystallizing the amorphous semiconductor film 55 shown in FIG. 11B through a solid phase reaction, the heat treatment can be carried out in the non-oxidation low pressure atmosphere. At this time, when the heat treatment is carried out continuously in the same film formation apparatus as the step of the amorphous semiconductor film filling step, adhesion of pollutants to the surface of the substrate can be reduced and the throughput is also improved.

The non-oxidation heat treatment can be performed by introducing the low pressure atmosphere after flattening is performed by polishing, and in this case, it can also reduce the void by the movement of silicon atoms on the surface of the void.

(Tenth Embodiment)

Next, a tenth embodiment will be described mainly on points different from the first and sixth embodiments.

Figure 16A:
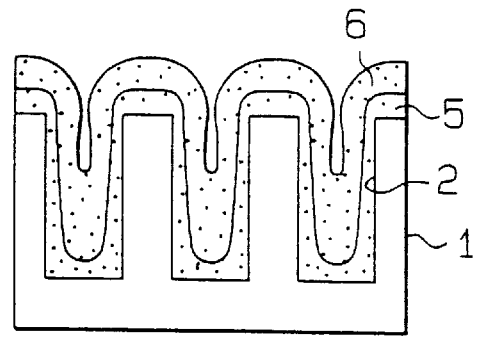
FIGS. 16A to 16D are cross-sectional views each showing a semiconductor substrate in a stepwise manner for explaining a tenth preferred embodiment.
Figure 16B:
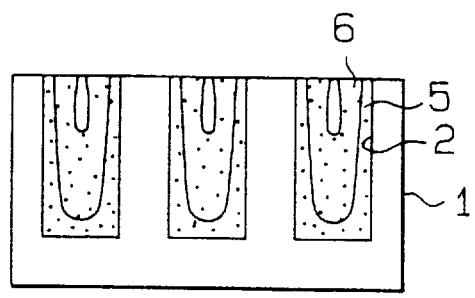
Figure 16C:
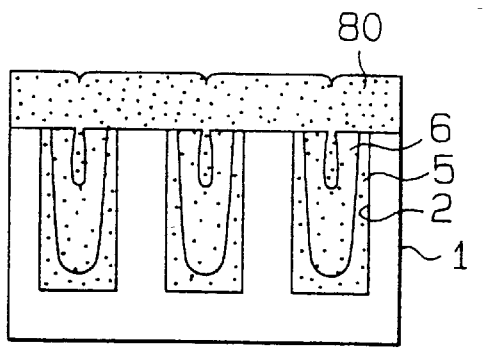

First, as shown in FIG. 2A, after the trench 2 is formed on the silicon substrate 1, the epitaxial film 5 is formed, and as shown in FIG. 2B, a part of the epitaxial film 5 is etched. Then, as shown in FIG. 16A, the epitaxial film 6 is grown to cause the void at the center of the trench 2. Then, as shown in FIG. 16B, a flattening treatment such as polishing is carried out to the epitaxial films 5 and 6 to expose the void. Further, as shown in FIG. 16C, an epitaxial film 80 is again formed to be filled in the void. Accordingly, the void can be filled to disappear. At this time, when reactive rate controlling film formation at a low temperature (600° C. or less) is carried out, the filling effect becomes high.

In detail, as step conditions (re-filling step of the void), a film formation apparatus is an LP-CVD, for example $SiH_4$ is used as a film formation material, and a film formation temperature is set to be in a range of 300° C. to 1200° C. Incidentally, since the silicon film varies among a single crystal film, a polycrystalline silicon film, and an amorphous film according to the temperature of film formation, any one is used.

Figure 16D:
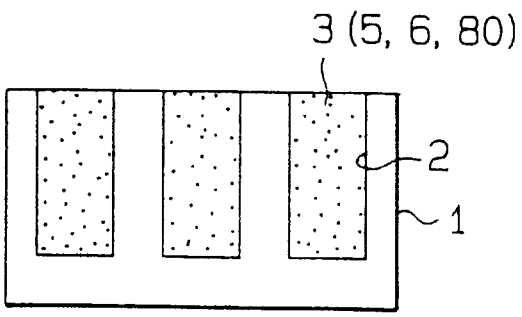

After the film 80 is formed, as shown in FIG. 16D, the flattening treatment (polishing or etch-back) is again carried out. More specifically, this embodiment is applied to a comparative example including steps of trench etching→HF washing (removal of natural oxide film)→heat treatment (removal of natural oxide film)→epitaxial film formation→HCl etching→re-epitaxial film formation (improvement of filling property by low temperature film formation)→primary polishing→sacrificial oxidation→finish polishing.

That is, this embodiment is performed by steps of trench etching→HF washing (removal of natural oxide film)→heat treatment (removal of natural oxide film)→epitaxial film formation→HCl etching→re-epitaxial film formation (improvement of filling property by low temperature film formation)→non-oxidation heat treatment under low pressure (which has been described in the ninth embodiment)→primary polishing→sacrificial oxidation→finish polishing→silicon filling (300 to 1200° C., single crystal, polysilicon or amorphous silicon) as a re-filling step of the void→primary polishing→finish polishing.

Like this, as the method of manufacturing a semiconductor substrate, in the flattening treatment step, at the point when the void at the center portion of the filling epitaxial films 5 and 6 in the trench 2 is exposed on the surface, the epitaxial film 80, the single crystal silicon film, or the amorphous film is formed to be filled in the void. Further, the flattening treatment is carried out, so that the void can be reduced. This method can be applied to the sixth embodiment in addition to the first embodiment. That is, if a void is produced in FIG. 11C, in the flattening treatment step of the filled films 54 and 56 in the trench 52, at the point when the void of the center of the filled layers 54 and 56 is exposed on the surface, the epitaxial film 80, the polycrystalline film, or the amorphous film is formed to be filled in the void. Then, the flattening treatment is carried out.

(Eleventh Embodiment)

Next, an eleventh embodiment will be described mainly on points different from the first and sixth embodiments. In this embodiment, with reference to FIGS. 17A and 17B, when a growth rate of an epitaxial film 93 on a bottom of a trench 92 is α, a growth rate of an epitaxial film 93 on a side of the trench 92 is β, a width of the trench 92 at the opening portion is F, and a depth of the trench is B, the relation of $$B/\alpha < F/2\beta$$

is satisfied.

Figure 17A:
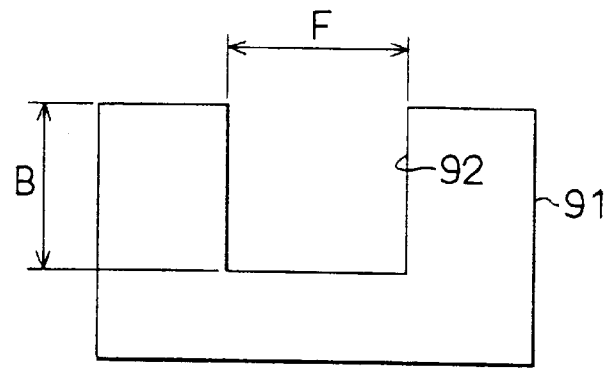
FIGS. 17A and 17B are cross-sectional views showing a semiconductor substrate, for explaining an eleventh preferred embodiment.
Figure 17B:
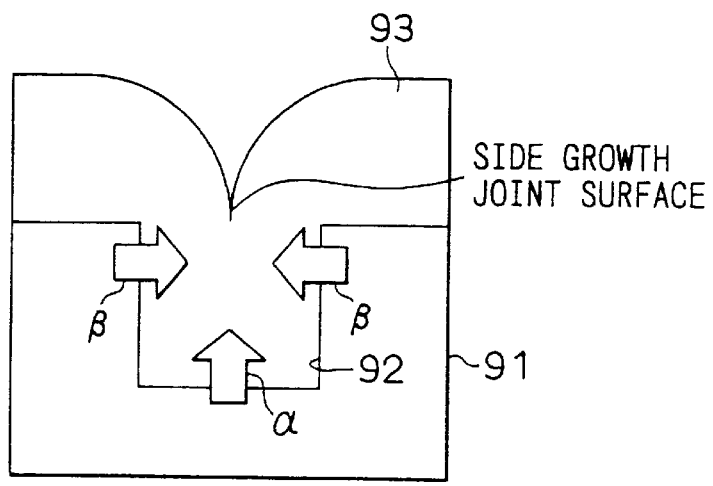
Figure 18:
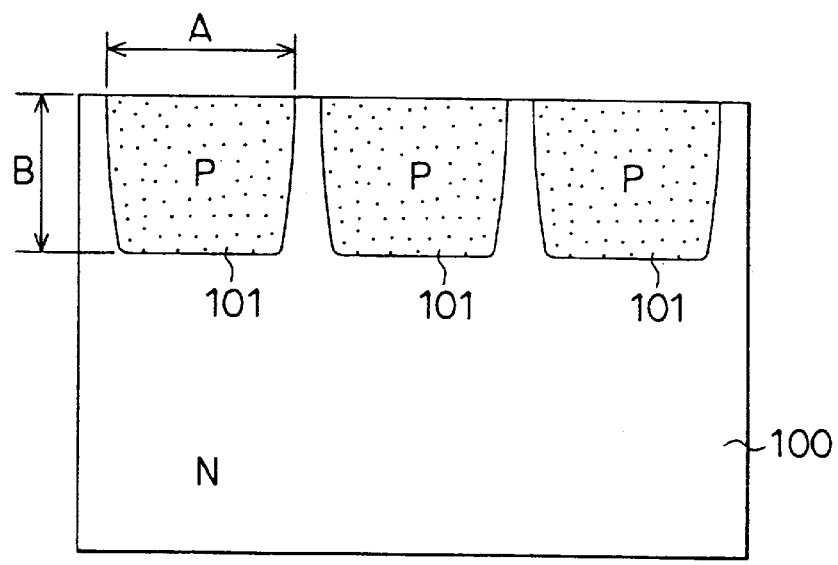
FIG. 18 is a cross-sectional view showing a semiconductor substrate, for explaining a conventional method.
Figure 19A:
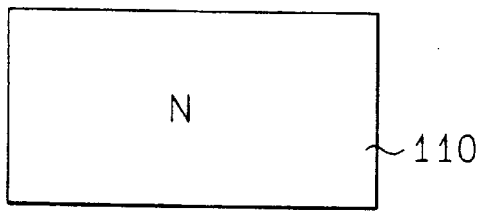
FIGS. 19A to 19C and 20A to 20C are cross-sectional views each showing a semiconductor substrate in a stepwise manner for explaining a conventional epitaxial growth method.
Figure 19B:
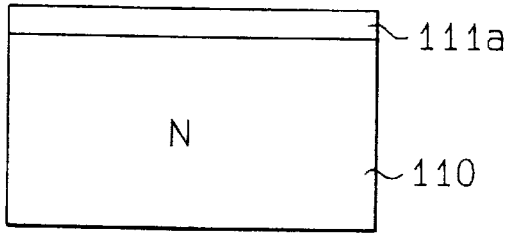
Figure 19C:
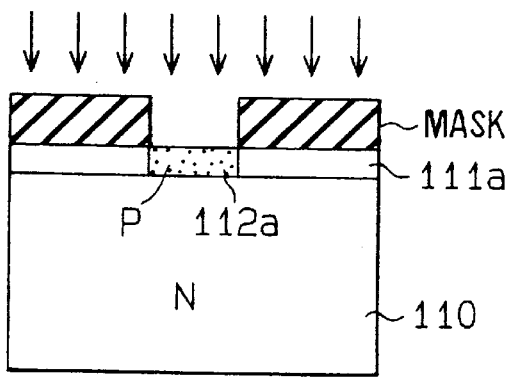
Figure 20A:
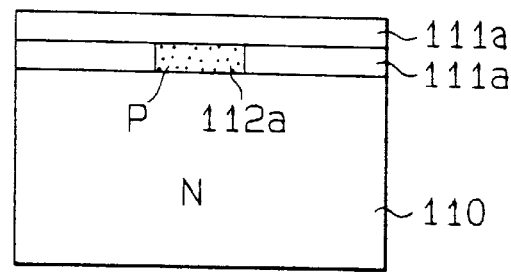
Figure 20B:
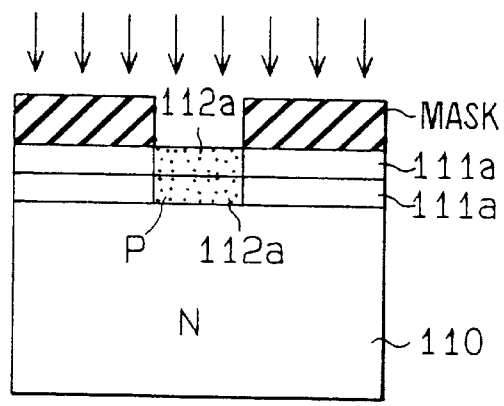
Figure 20C:
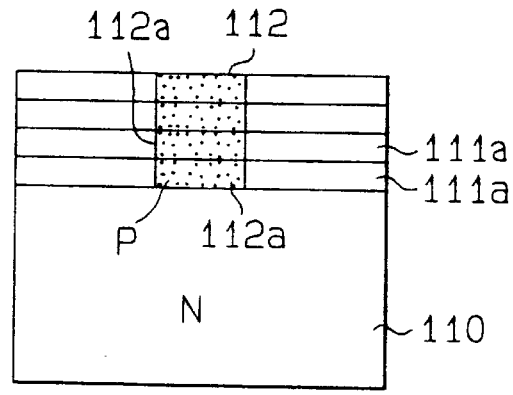
Figure 21A:
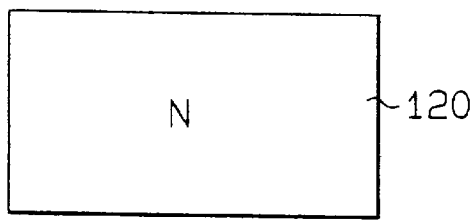
FIGS. 21A to 21C are cross-sectional views each showing a semiconductor substrate in a stepwise manner for explaining a conventional trench-epitaxial method.
Figure 21B:
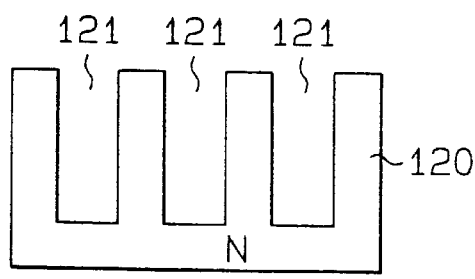
Figure 21C:
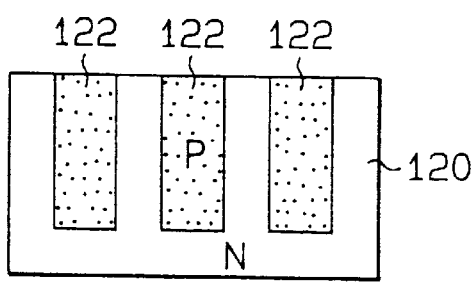
Figure 22A:
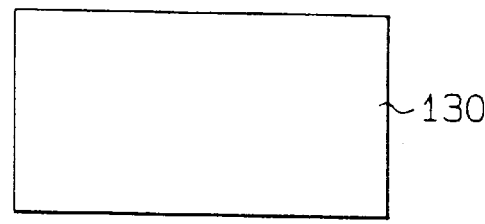
FIGS. 22A to 22C are cross-sectional views each showing a semiconductor substrate in a stepwise manner for explaining a conventional selective epitaxial growth.
Figure 22B:
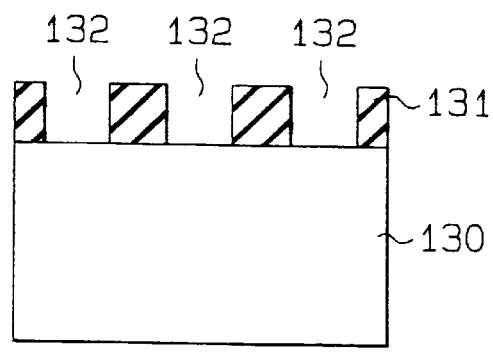
Figure 22C:
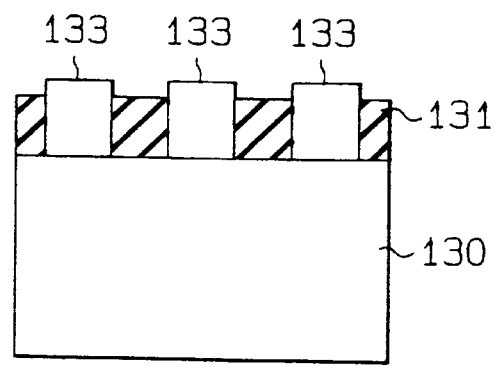

In detail, as shown in FIG. 17A, a substrate 91 having the trench 92 is prepared. When the epitaxial film 93 is grown as shown in FIG. 17B in the trench 92 of the substrate 91, since a growth joint surface from the sides of the trench becomes a cause of a void, the trench shape and the epitaxial film growth rate (side, bottom) in the trench are optimized such that the joint surface corresponds to the initial trench upper portion.

As a concrete example, it is assumed that Si (110) is used as the substrate, and wet etching by TMAH is carried out as trench etching. In this case, the trench inside growth rates are β=0.45 μm/min, and α=0.38 μm. In the case where the width F of the opening portion is 18 μm, the depth B is set to be smaller than 7.6 μm to satisfy the foregoing relation, as the trench structure.

Like this, in the method of manufacturing a semiconductor device in which after the trench 92 is formed in the semiconductor substrate 91, the epitaxial film 93 is formed by the epitaxial growth method on the semiconductor substrate 91 including the inside of the trench 92, and the surface of the epitaxial film 93 on the semiconductor substrate 91 is flattened, the foregoing relation (B/α<F/2β) is satisfied. Thus, occurrence of the void can be suppressed.

This method can be applied to the first embodiment. That is, in FIGS. 2A and 2C, it can be applied when the epitaxial films 5 and 6 are grown in the trench. Otherwise, this method can be applied to the sixth embodiment. That is, in FIG. 11A, when the amorphous semiconductor film is grown in the trench 52, the relation of B/α<F/2β is made to be satisfied in which a growth rate of the amorphous semiconductor film on the bottom of the trench is α, a growth rate of the amorphous semiconductor film on the side of the trench is β, the width of the trench at the opening portion is F, and the depth of the trench is B. Otherwise, when the epitaxial film 54 is grown in the trench 52 as shown in FIG. 11A, and when the amorphous semiconductor film 55 is grown in the trench 52 as shown in FIG. 11B, the relation among a growth rate α of both the films 54 and 55 on the trench bottom, a growth rate β on the trench side, and the sizes G, F of the trench may satisfy the relation of B/α<F/2β0.

With respect to examples other than the respective embodiments described so far, in the foregoing first to eleventh embodiments, the description has been made on the substrate processing method in which silicon is epitaxially grown on the silicon substrate so that the three-dimensional doping layer is formed. A similar processing technique can be applied also to another semiconductor material such as SiC, SiGe, or GaAs, and it is possible to realize doping layer formation for high integration in the substrate depth direction.

As the substrate structure, the first to eleventh embodiments have such structure that the doping layer is exposed at the surface of the substrate (for example, in FIG. 2D, the doping layer 3 is exposed at the upper surface of the substrate 1). However, such structure that the doping layer is internally included in the substrate, for example, in FIG. 2D, such structure that a silicon layer is disposed on the doping layer 3 may be adopted.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for manufacturing a semiconductor substrate, comprising;

forming a trench in a semiconductor substrate;

forming a first epitaxial film on a surface of the semiconductor substrate and in the trench;

etching a part of the first epitaxial film;

forming a second epitaxial film in the trench to fill the trench with the first epitaxial film and the second epitaxial film; and flattening the surface of the semiconductor substrate on which the first and second epitaxial firms are formed, wherein the part of the first epitaxial film is etched in an atmosphere including one of hydrogen chloride and hydrogen, by a gas phase etching action of the one hydrogen chloride and hydrogen.

2. The method according to claim 1, wherein the part of the first epitaxial film is formed in a vicinity of an opening portion of the trench and is etched before the second epitaxial film is formed.

3. The method according to claim 1, wherein, after the second epitaxial film is formed, etching of one of the first epitaxial film and the second epitaxial film and the formation of the second epitaxial film are performed at least once so that the trench is filled with the first epitaxial film and the second epitaxial film.

4. The method according to claim 1, wherein the surface of the semiconductor substrate is flattened by polishing.

5. The method according to claim 1, wherein the surface of the semiconductor substrate is flattened by etch-back of a dry etching treatment.

6. The method according to claim 1, wherein:

the surface of the semiconductor substrate is flattened by one of polishing and etch-back of a dry etching treatment; and an etching mask used for forming the trench is used as a stopper for the one of polishing and etch-back.

7. The method according to claim 1, wherein:

the trench is filled with the first and second epitaxial films to have a void at a generally center portion thereof;

the surface of the semiconductor substrate is flattened until the void is exposed thereon; and the void exposed by flattening is filled with a film that is one of an epitaxial film, a polycrystalline film, and an amorphous film.

8. The method according to claim 1, wherein the trench has a first width at a bottom thereof and a second width at an opening portion thereof, the second width being larger than the first width.

9. The method according to claim 1, wherein a relation of B/α<F/2β is satisfied, in which:

α is a first growth rate of each of the first epitaxial film and the second epitaxial film on the bottom of the trench;

β is a second growth rate of each of the first epitaxial film and the second epitaxial film on a side of the trench;

F is a width at an opening portion of the trench; and

B is a depth of the trench.

10. The method according to claim 1, wherein the trench is formed in the semiconductor substrate by an anisotropic etching.

11. The method according to claim 1, further comprising:
performing a thermal oxidation treatment to form an oxide film on the surface of the substrate including an inner surface of the trench after forming the trench; and
removing the oxide film so that an opening portion of the trench is enlarged.

12. The method according to claim 1, further comprising etching an upper portion of the trench before or after the trench is formed in the substrate so that an opening portion of the trench is enlarged.

13. The method according to claim 12, wherein the upper portion that is etched before or after the trench is formed has a depth shallower than a depth of the trench, and a width wider than a width at a bottom of the trench.

14. The method according to claim 1, wherein the formation of the first epitaxial film and the etching of the part of the first epitaxial film are performed continuously in an identical film formation apparatus.

15. The method according to claim 1, wherein, after the second epitaxial film is formed, etching of one of the first epitaxial film and the second epitaxial film and the formation of the second epitaxial film are performed alternately.

16. The method according to claim 1, wherein:
when the first epitaxial film is formed, the surface of the semiconductor substrate is exposed to a film formation gas including an element for forming the first epitaxial film, and is kept at a first temperature; and
when the part of the first epitaxial film is etched, the surface of the semiconductor substrate is exposed to an etching gas and is kept at a second temperature at which an etching reaction becomes a supply rate controlling process.

17. The method according to claim 1, wherein:
the trench is formed in the semiconductor substrate through an etching mask provided on the semiconductor substrate;
the first epitaxial film is formed on the surface of the semiconductor substrate and in the trench with the etching mask remaining on the semiconductor substrate so that the first epitaxial film includes a polycrystalline semiconductor formed around an opening portion of the trench; and
the polycrystalline semiconductor is selectively removed by etching as the part of the first epitaxial film.

18. The method according to claim 1, wherein:
the trench is formed in the semiconductor substrate through an etching mask provided on the semiconductor substrate; and
the first epitaxial film is formed after the etching mask is completely removed from the semiconductor substrate so that an entirety of the first epitaxial film is composed of a single crystal semiconductor.

19. The method according to claim 1, wherein the first epitaxial film is formed by using a gas including an impurity that is to be a dopant for the first epitaxial film.

20. The method according to claim 1, further comprising performing a heat treatment to the substrate under a low-pressure and non-oxidation atmosphere after the trench is filled with the first epitaxial film and the second epitaxial film.

21. The method according to claim 20, wherein the formation of the second epitaxial film and the heat treatment are continuously performed in an identical film formation apparatus.

22. A method for manufacturing a semiconductor substrate, comprising;
forming a trench in a semiconductor substrate;
filling an amorphous semiconductor film in the trench;
single-crystallizing the amorphous semiconductor film through a solid phase reaction caused by a heat treatment;
flattening the surface of the semiconductor substrate;
forming an epitaxial film in the trench before the amorphous semiconductor film is filled in the trench; and
etching a part of the epitaxial film before the amorphous semiconductor film is formed;
wherein the formation of the epitaxial film and the etching of the epitaxial film are performed once or a plurality of times,
wherein the etching of the part of the epitaxial film is carried out in an atmosphere including one of hydrogen chloride and hydrogen by a gas phase etching action of the one of hydrogen chloride and hydrogen.

23. The method according to claim 22, wherein the epitaxial film and the amorphous semiconductor film are continuously formed in an identical film formation apparatus.

24. The method according to claim 22, wherein the formation of the epitaxial film and etching of the part of the epitaxial film are performed alternately.

25. The method according to claim 22, wherein:
when the epitaxial film is formed, the surface of the semiconductor substrate is exposed to a film formation gas including an element for forming the epitaxial film, and is kept at a first temperature; and
when the part of the epitaxial film is etched, the surface of the semiconductor substrate is exposed to an etching gas and is kept at a second temperature at which an etching reaction becomes a supply rate controlling process.

26. The method according to claim 22, wherein:
the trench is formed in the semiconductor substrate through an etching mask provided on the semiconductor substrate;
the epitaxial film is formed on the surface of the semiconductor substrate and in the trench with the etching mask remaining on the semiconductor substrate so that the epitaxial film includes a polycrystalline semiconductor formed around an opening portion of the trench; and
the polycrystalline semiconductor is selectively removed by etching as the part of the epitaxial film.

27. The method according to claim 22, wherein:
the trench is formed in the semiconductor substrate through an etching mask provided on the semiconductor substrate; and
the epitaxial film is formed after the etching mask is completely removed from the semiconductor substrate so that an entirety of the epitaxial film is composed of a single crystal semiconductor.

28. The method according to claim 22, wherein the epitaxial film is formed by using a gas including an impurity that is to be a dopant for the epitaxial film.

29. A method for manufacturing a semiconductor substrate, comprising;
forming a trench in a semiconductor substrate;
forming an epitaxial film on a surface of the semiconductor substrate and in the trench;
etching a part of the epitaxial film;
forming a conductive material film on the epitaxial film so that the conductive material film is filled in the epitaxial film formed in the trench; and flattening the surface of the semiconductor substrate on which the epitaxial film and conductive material film are formed, wherein the formation of the epitaxial film and the etching of the epitaxial film are performed once or a plurality of times, wherein the etching of the part of the epitaxial film is carried out in an atmosphere including one of hydrogen chloride and hydrogen, by a gas phase etching action of the one of hydrogen chloride and hydrogen.

30. The method according to claim 29, wherein the trench is formed in the semiconductor substrate by an anisotropic etching treatment.

31. The method according to claim 29, wherein the epitaxial film is formed by using a gas including an impurity that is to be a dopant for the epitaxial film.

32. The method according to claim 29, wherein the conductive material film is made of one of a metallic material and a metallic silicide material.

33. The method according to claim 32, wherein when the conductive material film is made of the metallic silicide material, the conductive material film is formed by forming a metallic film and by transforming the metallic film into a metallic silicide film.

34. The method according to claim 29, wherein the conductive material film filled in the epitaxial film is a polycrystalline semiconductor film having a high dopant concentration and a conductivity type identical with a conductivity type of the epitaxial film.

35. The method according to claim 29, wherein the surface of the semiconductor substrate is flattened by polishing.

36. A method of manufacturing a semiconductor substrate, comprising:

forming a trench having a first depth in a semiconductor substrate;

growing an epitaxial film in the trench from side surfaces of the trench; and removing a surface portion of the epitaxial film and a surface portion of the semiconductor substrate to reduce any void that may be formed in the surface portion of the epitaxial film grown from the side surfaces of the trench, and so that the trench has a second depth smaller than the first depth and is completely filled with the epitaxial film.

37. A method for manufacturing a semiconductor substrate, comprising:

forming a trench in a semiconductor substrate;

forming an epitaxial film on a surface of the semiconductor substrate and in the trench; and flattening the surface of the semiconductor substrate on which the epitaxial film is formed, wherein:

a relation of $B/\alpha < F/2\beta$ is satisfied, in which:

$\alpha$ is a first growth rate of the epitaxial film on a bottom of the trench;

$\beta$ is a second growth rate of the epitaxial film on a side of the trench;

F is a width at an opening portion of the trench; and

B is a depth of the trench.

38. The method of manufacturing a semiconductor substrate according to claim 36, wherein the growing of the epitaxial film further comprises growing the epitaxial film from a bottom surface of the trench and an upper surface of the semiconductor substrate; and wherein the removing of a surface portion of the epitaxial film further comprises removing the epitaxial film on the upper surface of the semiconductor substrate.

* * * * *